(12) United States Patent
Hong et al.

(10) Patent No.: US 10,340,219 B2
(45) Date of Patent: Jul. 2, 2019

(54) SEMICONDUCTOR DEVICE HAVING A METAL VIA

(71) Applicant: SAMSUNG ELECTRONICS CO., LTD., Suwon-si, Gyeonggi-Do (KR)

(72) Inventors: Seul Ki Hong, Seoul (KR); Heon Jong Shin, Yongin-si (KR); Hwi Chan Jun, Yongin-si (KR); Min Chan Gwak, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/868,379

(22) Filed: Jan. 11, 2018

(65) Prior Publication Data

US 2018/0358293 A1 Dec. 13, 2018

(30) Foreign Application Priority Data

Jun. 8, 2017 (KR) .................... 10-2017-0071676

(51) Int. Cl.
| | | |
|---|---|---|
| *H01L 29/66* | (2006.01) | |
| *H01L 21/321* | (2006.01) | |
| *H01L 23/485* | (2006.01) | |
| *H01L 21/3213* | (2006.01) | |
| *H01L 29/06* | (2006.01) | |

(Continued)

(52) U.S. Cl.
CPC .... *H01L 23/5226* (2013.01); *H01L 21/32115* (2013.01); *H01L 21/32137* (2013.01); *H01L 23/485* (2013.01); *H01L 23/535* (2013.01); *H01L 23/53261* (2013.01); *H01L 27/0886* (2013.01); *H01L 29/0649* (2013.01); *H01L 29/66545* (2013.01); *H01L 29/7851* (2013.01); *H01L 23/53257* (2013.01); *H01L 23/53295* (2013.01)

(58) Field of Classification Search
CPC ... H01L 29/06; H01L 29/78; H01L 29/66545; H01L 29/7851; H01L 29/0649; H01L 23/5226; H01L 23/53257; H01L 23/535; H01L 23/53261; H01L 27/0886; H01L 21/32115; H01L 21/32137
USPC ........ 257/401, 392, 390, 288, 774; 438/286, 438/300, 667
See application file for complete search history.

(56) References Cited

U.S. PATENT DOCUMENTS

| | | |
|---|---|---|
| 6,594,813 B1 | 7/2003 | Gandhi et al. |
| 6,791,154 B2 | 9/2004 | Matsumoto et al. |

(Continued)

*Primary Examiner* — Dao H Nguyen
(74) *Attorney, Agent, or Firm* — F. Chau & Associates, LLC

(57) ABSTRACT

A semiconductor device includes a substrate having a device isolation region defining an active region. An active fin is positioned in the active region. A gate structure overlaps the active fin along a direction orthogonal to an upper surface of the substrate and extends in a second direction intersecting the first direction. A source/drain region is disposed on the active fin. A contact plug is connected to the source/drain region and overlaps the active fin. A metal via is positioned at a first level above the substrate higher than an upper surface of the contact plug and spaced apart from the active fin. A metal line is positioned at a second level above the substrate, higher than the first level and connected to the metal via. A via connection layer extends from an upper portion of the contact plug and is connected to the metal via.

21 Claims, 23 Drawing Sheets

(51) Int. Cl.
*H01L 29/78* (2006.01)
*H01L 23/522* (2006.01)
*H01L 23/532* (2006.01)
*H01L 23/535* (2006.01)
*H01L 27/088* (2006.01)

(56) References Cited

U.S. PATENT DOCUMENTS

| | | |
|---|---|---|
| 7,022,563 B2 | 4/2006 | Ootsuka et al. |
| 9,006,834 B2 | 4/2015 | Schultz |
| 9,466,604 B2 | 10/2016 | Woo et al. |
| 9,553,028 B2 | 1/2017 | Xie et al. |
| 9,899,321 B1* | 2/2018 | Park ............... H01L 23/528 |
| 2015/0235922 A1* | 8/2015 | Chen ............... H01L 23/481 |
| | | 257/383 |
| 2016/0190141 A1* | 6/2016 | Lee ............... H01L 27/1104 |
| | | 257/390 |
| 2016/0336289 A1 | 11/2016 | Tseng et al. |
| 2016/0372415 A1* | 12/2016 | Siew ............... H01L 27/0886 |
| 2017/0040318 A1* | 2/2017 | Hung ............... H01L 27/0886 |
| 2018/0033866 A1* | 2/2018 | Liao ............... H01L 21/28123 |

\* cited by examiner

SEMICONDUCTOR DEVICE HAVING A METAL VIA

CROSS-REFERENCE TO RELATED APPLICATION

This application claims priority under 35 U.S.C. § 119 to Korean Patent Application No. 10-2017-0071676 filed on Jun. 8, 2017 in the Korean Intellectual Property Office, the disclosure of which is incorporated by reference herein its entirety.

1. TECHNICAL FIELD

Exemplary embodiments of the present inventive concept relate to a semiconductor device, and more particularly to a semiconductor device having a metal via.

2. DISCUSSION OF RELATED ART

In some semiconductor devices such as a logic circuit and a memory, interconnection structures such as a contact plug for connection to a metal line of a back end of line (BEOL), as well as a source and a drain, have been used.

In highly integrated semiconductor devices, a line width and/or a pitch may be reduced or a routing may become relatively complicated, and an undesired short defect with a component adjacent to an interconnecting structure may occur.

SUMMARY

An exemplary embodiment of the present inventive concept provides a semi conductor device having a novel interconnection structure having a reduced amount of short defects with adjacent components.

According to an exemplary embodiment of the present inventive concept, a semiconductor device includes a substrate having a device isolation region defining an active region. An active fin is positioned in the active region and extends in a first direction. A gate structure overlaps the active fin along a direction orthogonal to an upper surface of the substrate and extends in a second direction intersecting the first direction. A source/drain region is disposed on the active fin. A contact plug is connected to the source/drain region and overlaps the active fin along the direction orthogonal to the upper surface of the substrate. A metal via is positioned at a first level above the substrate higher than an upper surface of the contact plug and spaced apart from the active fin along the direction orthogonal to the upper surface of the substrate. A metal line is positioned, at a second level above the substrate, higher than the first level and connected to the metal via. A via connection layer extends from an upper portion of the contact plug and is connected to the metal via.

According to an exemplary embodiment of the present inventive concept, a semiconductor device includes a substrate having a device isolation region defining a first active region and a second active region. A first active fin and a second active fin are positioned in the first active region and the second active region, respectively, and extend in a first direction. A first gate structure and a second gate structure overlap the first active fin and the second active fin, respectively, along a direction orthogonal to an upper surface of the substrate and extend in a second direction intersecting the first direction. A first source/drain region and a second source/drain region are disposed on the first active fin and the second active fin, respectively. A first contact plug and a second contact plug are connected to the first source/drain region and the second source/drain region, respectively. The first contact plug overlaps the first active fin along the direction orthogonal to the upper surface of the substrate. A metal via is positioned at a first level above the substrate, higher than an upper surface of the first contact plug, and spaced apart from the active fin along the direction orthogonal to the upper surface of the substrate. A metal line is positioned at a second level above the substrate, higher than the first level, and is connected to the metal via. A via connection layer extends from an upper portion of the first contact plug to the metal via.

According to an exemplary embodiment of the present, inventive concept, a semiconductor device includes an active region having an upper surface in which a plurality of active fins are defined. A gate structure overlaps at least one active fin of the plurality of active fins along a direction orthogonal to an upper surface of the substrate. A source/drain region is disposed on the plurality of active fins. A contact plug has a lower surface connected to the source/drain region. A metal via is spaced apart from the contact plug along the direction orthogonal to the upper surface of the substrate and is surface of the contact plug. A metal line is positioned at a second level, higher than the first level, and is connected to the metal via. A via connection layer has an upper surface substantially coplanar with the upper surface of the contact plug, extends from an upper portion of the contact plug and is connected to the metal via.

According to an exemplary embodiment of the present inventive concept, a semiconductor device includes a substrate including a first active region and a second active region. A first active fin is positioned in the first active region. A first source/drain region is disposed on the first active fin. A first contact plug is positioned above the first source/drain region. A first via connection layer is positioned above the first contact plug. The first via connection layer includes a first portion overlapping the first contact plug along a direction orthogonal to an upper surface of the substrate, and a second portion spaced apart from the first contact plug along the direction orthogonal to the upper surface of the substrate. A first metal via is disposed on the second portion of the first via connection layer. A first metal line is disposed on the first metal via. A second active fin is positioned in the second active region. A second source/drain region is disposed, on the second active fin. A second contact plug is positioned above the second source/drain region. A second via connection layer is positioned above the second contact plug and overlaps the second contact plug along the direction orthogonal to the upper surface of the substrate. A second metal via is disposed on the second via connection layer. A second metal line is disposed on the second metal via.

BRIEF DESCRIPTION OF DRAWINGS

The above and other features of the inventive concept will become more apparent by describing in detail exemplary embodiments thereof, with reference to the accompanying drawing, in which.

DETAILED DESCRIPTION

Figure 1A:
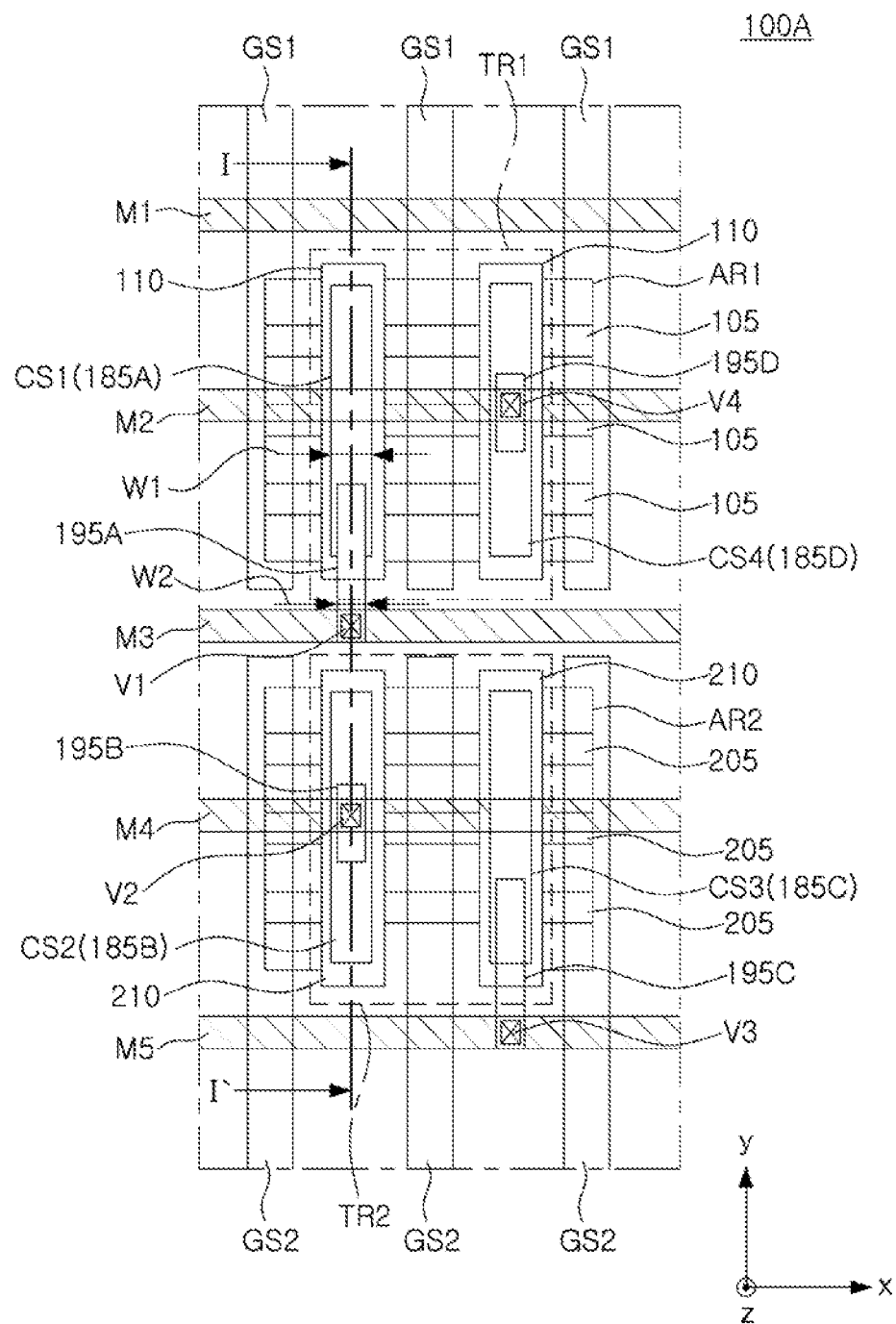
FIG. 1A is a planar layout diagram illustrating a semiconductor device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

Figure 1B:
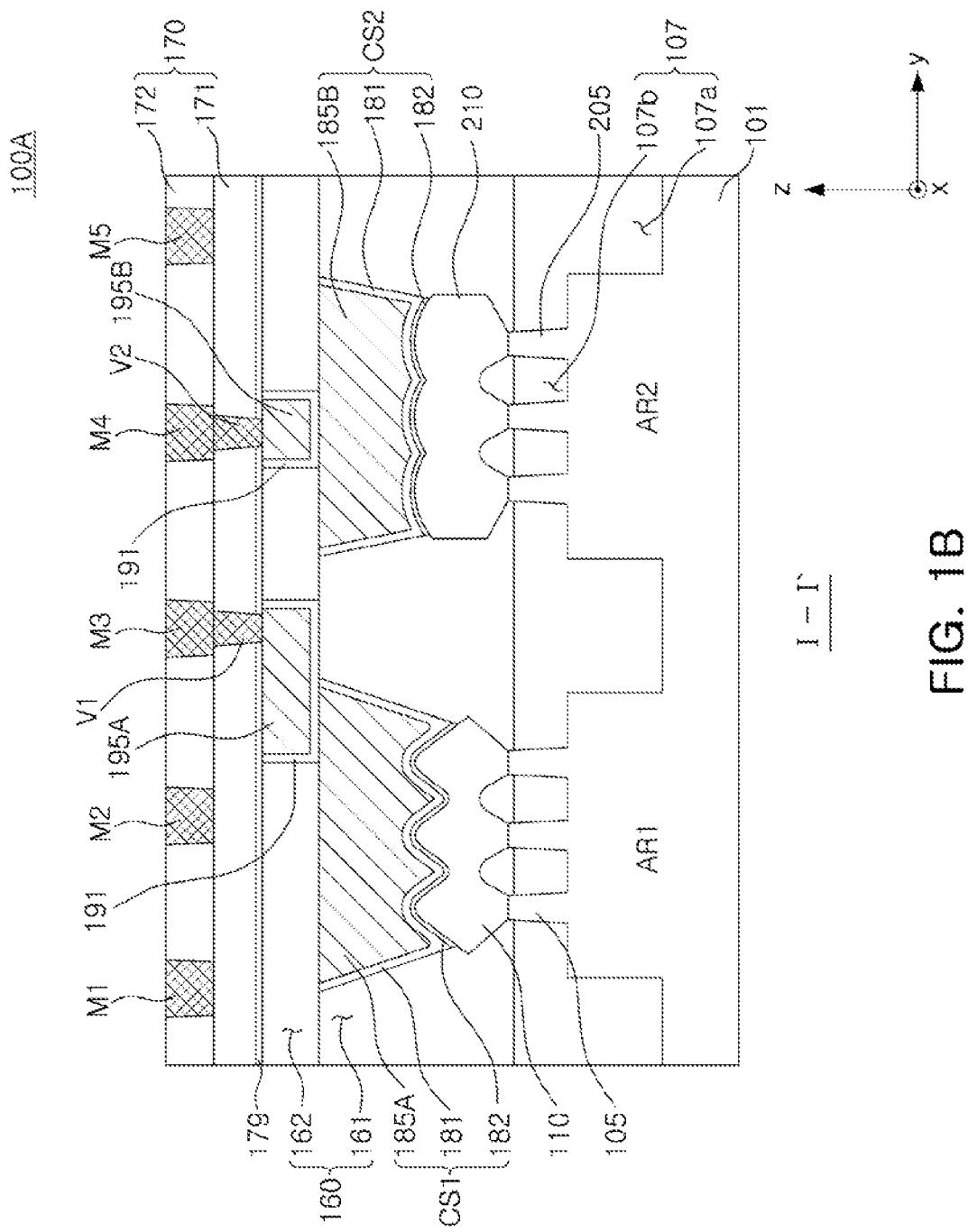
FIG. 1B is a cross-sectional view taken along line I-I' of FIG. 1A.

FIG. 1A is a planar layout diagram illustrating a semiconductor device according to an exemplary embodiment of the present inventive concept. FIG. 1B is a cross-sectional view taken along line I-I' of FIG. 1A.

Referring to FIGS. 1A and 1B, a semiconductor device 100A according to an exemplary embodiment of the present inventive concept may include a first active region AR1 and a second active region AR2 of a substrate 101 formed by a device isolation region 107. For example, each of the first and second active regions AR1 and AR2 formed by the device isolation region 107, as well as the active fins (e.g., active fins 105 and 205 described in more detail below) may be a part of the substrate 101.

In an exemplary embodiment of the present inventive concept, the substrate 101 may include a semiconductor such as Si or Ge, or a compound semiconductor such as SiGe, SiC, GaAs, InAs, or InP. In an exemplary embodiment of the present inventive concept, the substrate 101 may have a silicon on insulator (SOI) structure. The first active region AR1 and the second active region AR2 may each be a conductive region such as a well doped with an impurity or a structure doped with an impurity. In an exemplary embodiment of the present inventive concept, the first active region AR1 may be an n-type well for a PMOS transistor, and the second active region AR2 may be a p-type well for an NMOS transistor; however, exemplary embodiments of the present invention are not limited thereto.

A first active fin 105 may be positioned, in an upper surface of the first active region AR1, and a second active fin 205 may be positioned in an upper surface of the second active region AR2. Each of the first active fin 105 and the second active fin 205 may include a structure protruding from an upper surface of each of the first active region AR1 and the second active region AR2 along a direction orthogonal to an upper surface of the substrate 101 (e.g., in a z-direction). In an exemplary embodiment of the present inventive concept, each of the first active fin 105 and the second active fin 205 may include three active fins; however, exemplary embodiments of the present invention are not limited to a particular number of active fins. In an exemplary embodiment of the present inventive concept, each of the first active fin and the second active fin may include a single active fin or a different number of active fins than three active fins.

Referring to FIG. 1A, each of the active fins of the first active fins 105 and each of the active fins of the second active fin 205 may extend in-parallel with each other in the first active region AR1 and the second active region AR2, respectively, along a first direction (e.g., along an x direction). Each of the first active fin 105 and the second active fin 205 may be an active region of a transistor.

The device isolation region 107 defines the first active region AR1 and the second active region AR2. The device isolation region 107 may include a silicon oxide or a silicon oxide-based insulating material. The device isolation region 107 may include a first isolation region 107a defining an active region and a second isolation region 107b defining the first active fin 105 and the second active fin 205. The first isolation region 107a has a bottom surface deeper than that of the second isolation region 107b. The first isolation region 107a may be referred to as a deep trench isolation (DTI) region, and the second isolation region 107b may be referred to as a shallow trench isolation (STI) region.

The second, isolation, region 107b may be positioned in the first active region AR1 and the second active region AR2. The first active fin 105 and the second active fin 205 may pass through the second isolation region 107b. At least one of the first active fin 105 and the second, active fin 205 may extend above an upper surface of the second isolation region 107b.

The semiconductor device 100A according to an exemplary embodiment of the present inventive concept may include a first gate structure GS1 and a second gate structure GS2. Referring to FIG. 1A, the first gate structure GS1 and the second gate structure GS2 may each have a linear shape (e.g., a rectangular shape when viewed from a plan view) extended in a second direction (e.g., a y direction) intersecting the first direction (e.g., the x direction). The first gate structure GS1 may overlap a portion of the first active fin 105, and the second gate structure GS2 may overlap a portion of the second active fin 205 along the direction orthogonal to the upper surface of the substrate 101. The first gate structure GS1 and the second gate structure GS2 according to an exemplary embodiment of the present inventive concept will be described in more detail below with reference to FIG. 3B.

The semiconductor device 100A according to an exemplary embodiment of the present inventive concept may include a first source/drain region 110 and a second source/drain region 210, as well as a first contact structure CS1, a second contact structure CS2, a third contact structure CS3, and a fourth contact structure CS4 connected, to the first source/drain region 110 and the second source/drain region 210.

The first source/drain region 110 and the second source/drain region 210 may be formed in portions of the first active fin 105 and the second active fin 205 at opposite sides of the first gate structure GS1 and the second gate structure GS2, respectively. In an exemplary embodiment of the present inventive concept, the first source/drain region 110 and the second source/drain region 210 may have an upper surface at a level, higher than that of an upper surface of the first active fin 105 and the second active fin 205, as a recess may be formed in a portion of the first active fin 105 and the second active fin 205, and selective epitaxial growth (SEG) may be performed in the recess. The first source/drain region 110 and the second source/drain region 210 may be referred to as a raised source/drain (RSD). For example, the first source/drain region 110 and the second source/drain region 210 may each include Si, SiGe, or Ge, and may each have a conductivity type such as an N-type or a P-type.

In an exemplary embodiment of the present inventive concept, the first source/drain region 110 may include SiGe, and may be doped with a P-type impurity, for example, boron (B), indium (In), gallium (Ga), or boron trifluoride ($BF_3$). The second source/drain region 210 may include silicon (Si), and may be doped with an N-type impurity, for example, phosphorus (P), nitrogen (K), arsenic (As), or antimony (Sb). The first source/drain region 110 and the second source/drain region 210 may have different shapes from each other along a crystallographically stable surface during a growth process. Referring to FIG. 1B, a cross section (e.g., in a z direction) of the first source/drain region 110 may be pentagonal, and a cross section (e.g., in a z direction) of the second source/drain region 210 may be hexagonal or may have a polygon shape having at least one curved side.

A first FinFET TR1 including the first gate structure GS1, the first source/drain region 110 and the first active fin 105 may be formed on the first active region AR1. A second FinFET TR2 including the second gate structure GS2, the second source/drain region 210 and the second active fin 205 may be formed on the second active region AR2.

In the semiconductor device 100A according to an exemplary embodiment of the present inventive concept, an interlayer insulating layer 160 may be disposed on the device isolation region 107. The interlayer insulating layer 160 may include a first interlayer insulating layer 161 around the first gate structure GS1 and the second gate structure GS2 and a second interlayer insulating layer 162 disposed on the first interlayer insulating layer 161. For example, at least one of the first interlayer insulating layer 161 and the second interlayer insulating layer 162 may be Tetra Ethyl Ortho Silicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin-on-glass (SOG), Tonen SilaZene (TOSZ) or combinations thereof. The first interlayer insulating layer 161 and the second interlayer insulating layer 162 may each be formed using a chemical vapor deposition (CVD) or spin coating process.

In an exemplary embodiment of the present inventive concept, the first contact structure CS1, the second contact structure CS2, the third contact structure CS3, and the fourth contact structure CS4 may pass through the first interlayer insulating layer 161, and may be connected to the first source/drain region 110 and the second source/drain region 210, respectively. As an example, the first contact structure CS1 and the third contact structure CS3 may be connected to the first source/drain region 110 of the first FinFET TR1, and the second contact structure CS2 and the fourth contact structure CS4 may be connected to the second source/drain region 210 of the second FinFET TR2.

Referring to FIG. 1E, each of the first contact structure CS1, the second contact structure CS2, the third contact structure CS3, and the fourth contact structure CS4 may include a metal silicide layer 182, a first conductive barrier 181, as well as a first contact plug 185A, a second contact plug 185B, a third contact plug 185C, and a fourth contact plug 185D. The first conductive barrier 181 may cover a side surface and a lower surface of the first contact plug 185A, the second contact plug 185B, the third contact plug 185C, and the fourth contact plug 185D. The metal silicide layer 182 may be disposed between the first conductive barrier 131 and each of the first source/drain region 110 as well as the second source/drain region 210. For example, the first conductive barrier 181 may include a metal nitride such as TiN, TaN, or WN. The metal silicide layer 182 may include a material such as CoSi, NiSi, or TiSi. The first contact plug 185A, the second contact plug 185B, the third contact plug 185C, and the fourth contact plug 185D may include tungsten (W), cobalt (Co), titanium (Ti), alloys thereof, or combinations thereof.

The semiconductor device 100A according to an exemplary embodiment of the present inventive concept may include an interconnection structure connecting a metal line to a contact plug. The interconnection structure may include a metal via located in a contact point of a metal line and a via connection layer connecting the metal via to the contact plug.

Referring to FIGS. 1A and 1B, the metal line may include a first metal line M1, a second metal line M2, a third, metal line M3, a fourth metal line M4, and a fifth metal line M5 extended in a first direction (e.g., an x direction) on the first FinFET TR1 and the second FinFET TR2. The second metal line M2, the third metal line M3, the fourth metal line M4, and the fifth metal line M5, a portion of the first metal line M1, the second metal line M2, the third metal line M3, the fourth metal line M4, and the fifth metal line M5, as well as the first contact plug 185A, the second contact plug 185B, the third, contact, plug 185C, and the fourth contact plug 185D, may be connected to a first metal via V1, a second metal via V2, a third metal via V3, and a fourth metal via V4 through a first via connection layer 195A, a second via connection layer 195B, a third via connection layer 195C, and a fourth via connection layer 195D, respectively.

The first metal line M1, the second metal line M2, the third metal line M3, the fourth metal line M4, and the fifth metal line M5 may each be formed in a low dielectric layer 170. The low dielectric layer 170 employed in an exemplary embodiment of the present inventive concept may include a first low dielectric layer 171 and a second low dielectric layer 172 positioned above the interlayer insulating layer 160. The first metal line M1, the second metal line M2, the third metal line M3, the fourth metal line M4, and the fifth metal line M5 may be formed in the second low dielectric layer 172, and the first metal via V1, the second metal via V2, the third metal via V3, and the fourth metal via V4 may be formed in the first low dielectric layer 171. The first metal via V1, the second metal via V2, the third metal via V3, and the fourth metal via V4 may be formed in a contact point to be connected to a contact plug in the second metal line M2, the third metal line M3, the fourth metal line M4, and the fifth metal line M5, respectively. For example, the first, low dielectric layer 171 and the second low dielectric layer 172 may include a silicon oxide film, a silicon oxynitride film, a SiOC film, a SiCOH film, or combinations thereof. For example, the first metal line M1, the second metal line M2, the third metal line M3, the fourth metal line M4, and the fifth metal line M5, as well as the first metal via V1, the second metal via V2, the third metal via V3, and the fourth metal via V4 may include copper or a copper-containing alloy. The first metal line M1, the second metal line M2, the third metal line M3, the fourth metal line M4, and the fifth metal line M5, as well as the first metal via V1, the second metal via V2, the third metal via V3, and the fourth metal via V4 may be formed together using a dual-damascene process.

In an exemplary embodiment of the present inventive concept, an etch stop layer 179 may be disposed between the interlayer insulating layer 160 and the first low dielectric layer 171. For example. The etch stop layer 179 may be disposed between the second interlayer insulating layer 162 and the first low dielectric layer 171. The etch stop layer 179 may serve not only to stop etching, but also to prevent a metal (for example, Cu) forming the first metal line M1, the second metal line M2, the third metal line M3, the fourth metal line M4, and the fifth metal line M5, as well as the first metal via V1, the second metal via V2, the third metal via V3, and the fourth metal via V4 from being diffused to a lower region. As an example, the etch stop layer 179 may include aluminum nitride (AlN); however, exemplary embodiments of the present invention are not limited thereto.

Referring to FIGS. 1A and 1B, when viewed in a direction (e.g., a z direction) along the direction orthogonal to the upper surface of the substrate 101, the third metal line M3 related to the first contact plug 185A may be spaced apart from the first active region AR1 (i.e., does not overlap) along the direction orthogonal to the upper surface of the substrate 101. As an example, the first metal via V1 in direct contact with the third metal line M3 may be spaced apart from (i.e., does not overlap) the first active region AR1 along the direction orthogonal to the upper surface of the substrate 101.

As an example, an entire lower surface of the first contact, plug 185A may overlap the first active region AR1 along the direction orthogonal to the upper surface of the substrate 101. Referring to FIG. 1B, to allow the entire lower surface of the first contact plug 185A to overlap the first active region AR1 along the direction orthogonal to the upper surface of the substrate 101, a width d of the lower surface of the first contact plug 185A (see, e.g., FIG. 6) may be smaller than a width D (see, e.g., FIG. 6) of the first active region AR1.

When the first contact plug 185A for connection with the third metal line M3 is extended to a bottom of the first metal via V1 to be formed a short defect may occur with other components. For example, in the extended first contact plug 185A, a short defect may be caused with the second source/drain region 210 of the second FinFET TR2 adjacent thereto. In an exemplary embodiment of the present inventive concept, the first contact plug 185A is formed to allow a lower surface of the first, contact plug 185A to be present within a boundary of an upper surface of the first active region AR1, so an occurrence of an undesired short defect may be reduced or eliminated.

In an exemplary embodiment of the present inventive concept, to connect the first contact plug 185A to the first metal via V1, which do not overlap each other in a vertical direction along the direction orthogonal to the upper surface of the substrate 101 (e.g., a z direction), the first, via connection layer 135A may extend in a horizontal direction along a direction perpendicular to an upper surface of the substrate 101 (e.g., an x-y direction). The first via connection layer 195A according to an exemplary embodiment of the present inventive concept may be positioned between an upper surface of the first contact plug 185A and a level (e.g., a first level) in which the first metal via V1 is positioned. Referring to FIG. 1B, the first metal via V1 may be formed in the first low dielectric layer 171 formed on the second interlayer insulating layer 162.

An interconnection structure of the fifth metal line M5 and the third contact plug 185C is substantially the same as the metal lines (e.g., metal line M3) and the contact plugs (e.g., contact plug 185A) described above. As an example, the third contact plug 185C may be connected to the third metal via V3 located, in a region in which the third metal via does not overlap the third contact plug, by the third via connection layer 195C.

In a manner different from the first contact plug 185A and the third contact plug 185C, the second contact plug 185B and the fourth contact plug 185D may be positioned in a region in which the second, contact plug and the fourth contact plug overlap the second metal via V2 and the fourth metal via V4. Referring to FIG. 1B, the second contact plug 185B may be connected to the second metal via V2 by the second via connection layer 195B. The second via connection layer 195B may be formed in the second interlayer insulating layer 162 with, the first via connection layer 195A. The fourth contact plug 185D may have substantially a same structure as the second contact plug 185B.

Figure 5:
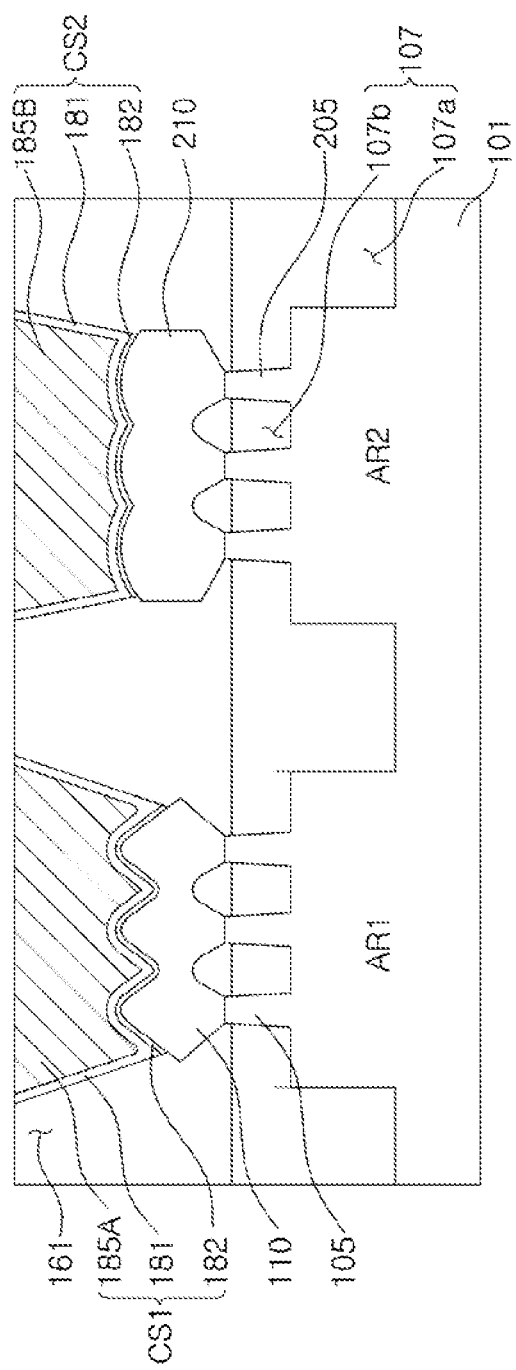
FIGS. 5 through 7 are drawings illustrating a method of manufacturing a semiconductor device according to an exemplary embodiment of the present inventive concept.
Figure 6:
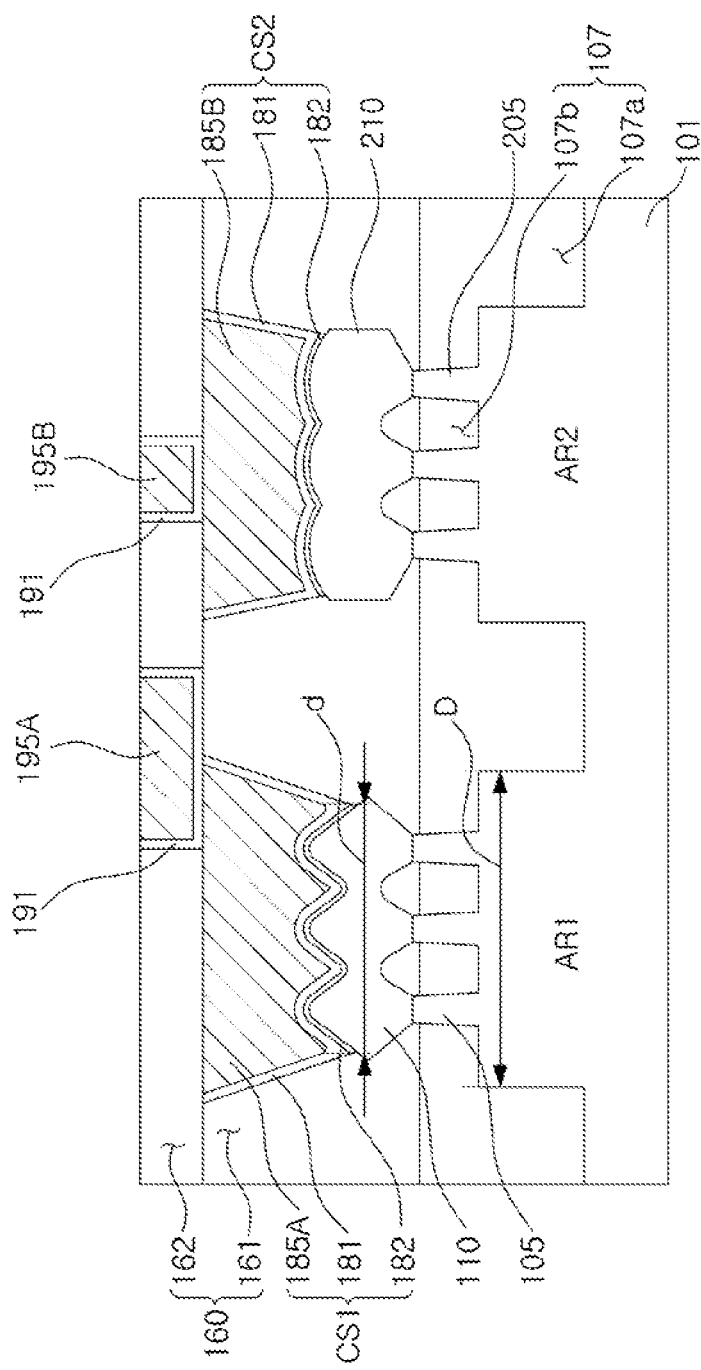
Figure 7:
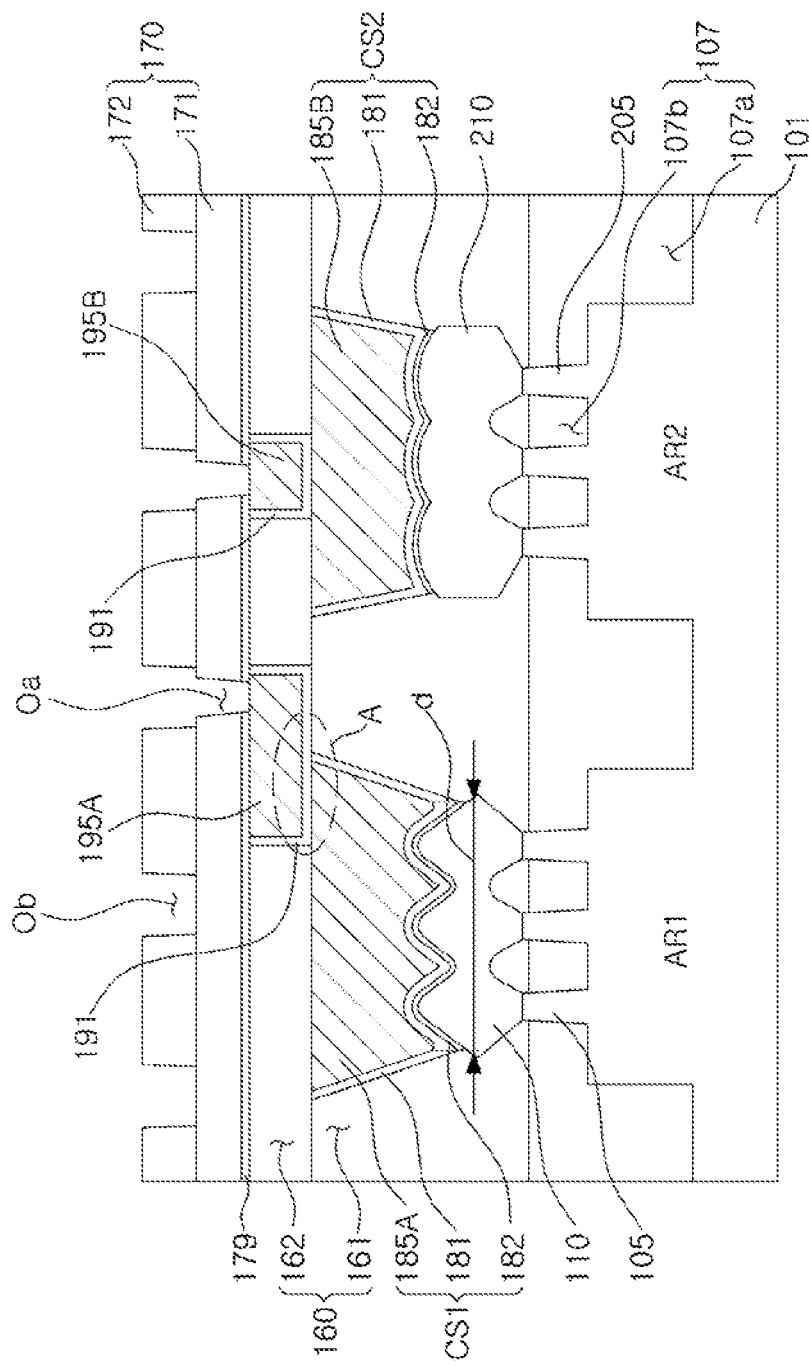

The first via connection layer 195A, the second via connection layer 195B, the third via connection layer 195C, and the fourth via connection layer 195D according to an exemplary embodiment of the present inventive concept, may be formed separately from the first contact plug 185A, the second contact, plug 185B, the third contact plug 185C, and the fourth contact plug 185D (see, e.g., FIGS. 5 through 7). Each of the first via connection layer 195A and the third via connection layer 195C may have a width W2 different from a width W1 of each of the first contact plug 185A and the third contact plug 185C when viewed in an extending direction. For example, the width W2 of each of the first via connection layer 195A and the third via connection layer 195C may be smaller than the width W1 of the each of the first contact plug 185A and the third contact plug 185C.

In a manner similar to the first conductive barrier 181, a second conductive barrier 191 may be formed between each of the first via connection layer 195A, the second via connection layer 195B, the third via connection layer 195C, as well as the fourth via connection layer 195D, and the second interlayer insulating layer 162. Referring to FIG. 1B, the second conductive barrier 191 may disposed on side surfaces and a lower surface of the first via connection layer 195A and the second via connection layer 195B. As an example, the second conductive barrier 191 may include metal nitride such as TiN, TaN, or WN. In an exemplary embodiment of the present inventive concept, a portion of the second conductive barrier 191 may be disposed between the first via connection layer 195A and the first contact plug 185A. As an example, the first via connection layer 195A, the second via connection layer 195B, the third via connection layer 195C, and the fourth via connection layer 195D may include W, Co, Ti, alloys thereof, or combinations thereof. In an exemplary embodiment of the present inventive concept, the first via connection layer 195A, the second via connection layer 195B, the third, via connection layer 195C, and the fourth via connection layer 195D may include a same material as the first contact plug 185A, the second contact plug 185B, the third contact plug 185C, and the fourth contact plug 185D.

An interconnection structure according to an exemplary embodiment of the present inventive concept is not limited to the example embodiment (referring to FIGS. 1A and 1B) described above, and an interconnection structure of a contact plug and a metal via positioned in a region in which the contact plug does not overlap the metal via may be variously changed.

In an exemplary embodiment of the present inventive concept described above, an additional interlayer insulating layer (e.g., a second interlayer insulating layer) may be formed between the metal via and the contact plug, and a via connection layer extended from an upper surface of the contact plug may be introduced to the additional interlayer insulating layer.

Alternatively, without the introduction of an additional insulating layer between a back end of line (BEOL) structure and a contact plug, the first interlayer insulating layer and a via connection layer formed in an upper end of the contact plug may be used to implement an interconnection structure with a metal via.

Referring to FIG. 1B, according to an exemplary embodiment of the present inventive concept, a semiconductor device may include the substrate 101 including the first active region AR1 and the second active region AR2. The first active fin 105 may be positioned in the first active region AR1. The first source/drain region 110 may be disposed on the first active fin 105. The first contact plug 185A may be positioned above the first source/drain region 110. The first via connection layer 195A may be positioned above the first contact plug 185A. The first via connection layer 135A may include a first portion overlapping the first contact plug 185A along a direction orthogonal to an upper surface of the substrate 101, and a second portion spaced apart from the first contact plug 185A along the direction orthogonal to the upper surface of the substrate 101. The first metal via V1 may be disposed on the second portion of the first via connection layer 135A. The metal line (e.g., metal line M3) may be disposed, on the first metal via V1. The second active fin 205 may be positioned in the second active region AR2. The second source/drain region 210 may be disposed on the second active fin 205. The second contact plug 185B may be positioned above the second source/drain region 210. The second via connection, layer 135B may be positioned above the second contact plug 185B and may overlap the second contact plug 185B along the direction orthogonal to the upper surface of the substrate 101. The second metal via V2 may be disposed on the second via connection layer 195B. A second, metal line (e.g., metal line M4) may be disposed on the second metal via V2.

Figure 2:
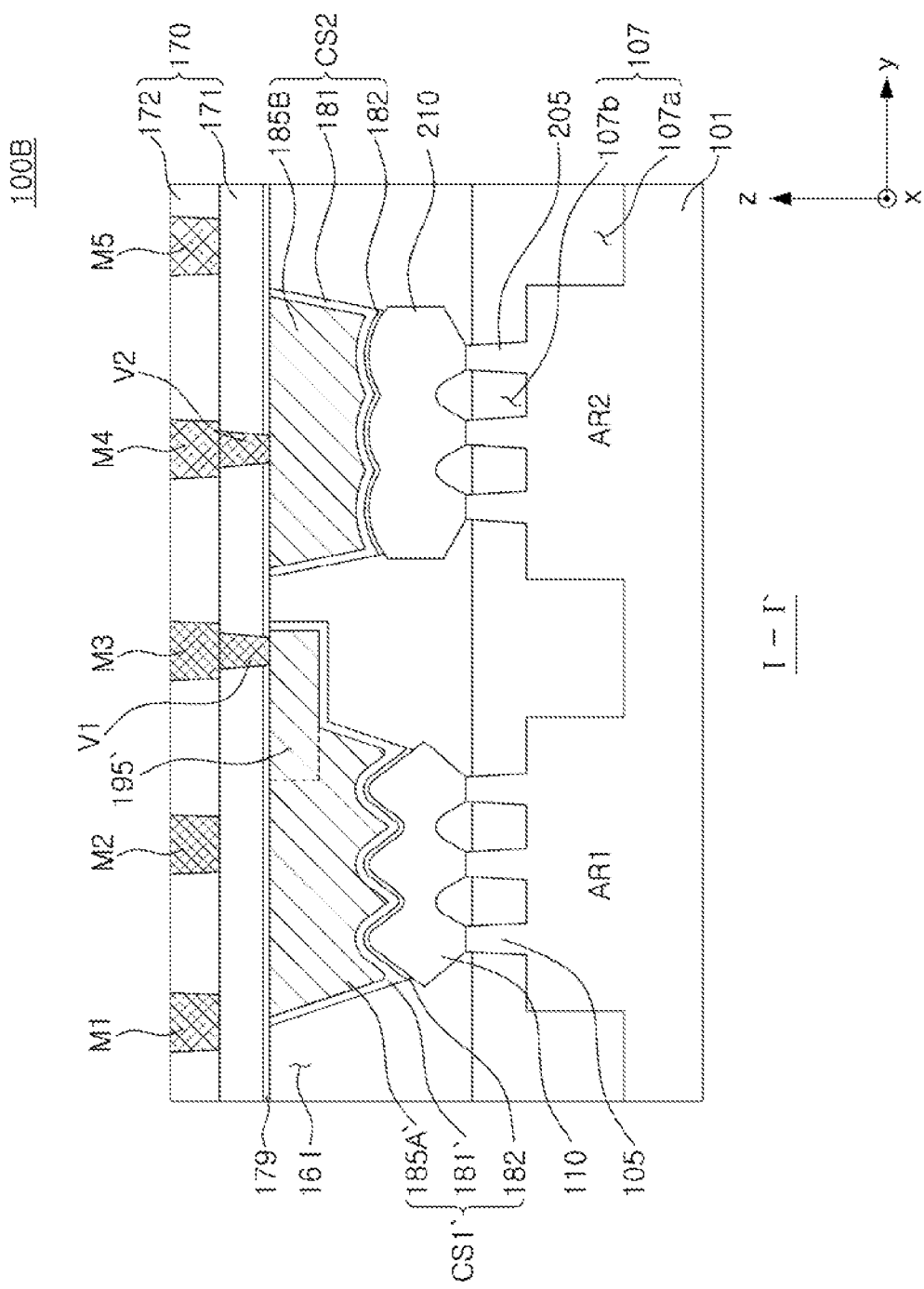
FIG. 2 is a cross-sectional view of a semiconductor device according to an exemplary embodiment of the present inventive concept.

FIG. 2 is a cross-sectional view of a semiconductor device according to an exemplary embodiment of the present inventive concept.

Referring to FIG. 2, a semiconductor device 100B according to an exemplary embodiment of the present, inventive concept is similar to the semiconductor device 100a described above with reference to FIG. 1A and FIG. 1B, except that the second interlayer insulating layer (162 of FIG. 1B) is omitted, and a via connection layer 195' is formed, in an upper portion of the first interlayer insulating layer 161 and a first contact plug 185A'. Thus, duplicative descriptions may be omitted below. For example, a layout of the semiconductor device 100A described above with reference to FIG. 1A and FIG. 1E and the description thereof may be applied to the semiconductor device 100B described in more detail below.

The via connection layer 195' according to an example embodiment of the present inventive concept may be formed, to be integrated with the first contact plug 185A' along an upper region of the first interlayer insulating layer 161. The via connection layer 195' and the first contact plug 185A' may be formed in a single filling process (described in more detail below with reference to FIGS. 8 through 12). The via connection layer 195' and the first contact plug 185A' may include same material, for example, a metal such as W, Co, or Ti.

In an exemplary embodiment of the present inventive concept, the first contact plug 185A' may have an upper surface that extends along a plane substantially the same as an upper surface of the via connection layer 195'. Thus, upper surfaces of the first contact plug 185A' and the via connection layer 195' may be coplanar. The coplanar upper surfaces of the first contact plug 185A' and the via connection layer 195' may be a surface obtained using a planarization process such as chemical mechanical polishing (CMP) after a filling process for the via connection layer 195' and the first contact plug 185A' (describe in more detail below with reference to FIGS. 11 and 12).

The first contact plug 185A integrated with the via connection layer 195 may have a single conductive barrier 181'. The conductive barrier 181' according to an exemplary embodiment of the present inventive concept may be disposed between an integrated structure and the first interlayer insulating layer 161, and need not be present between the via connection layer 195' and the first contact plug 185A'. As described above, in an exemplary embodiment of the present inventive concept, a contact structure CS1' integrated with the via connection layer 195' may be implemented. For example, the conductive barrier 181' may include metal nitride such as TiN, TaN, or WN.

According to an exemplary embodiment of the present inventive concept, a segregation of the via connection layer 195'' and the first contact plug 185A' may be omitted. For example, a portion extended from an upper portion of the first contact plug 185A' in a horizontal direction may be present, which may overlap the first metal via V1 along the direction orthogonal to the upper surface of the substrate 101.

Similarly to the first contact plug 185A', the third contact plug 185C, which does not overlap a metal via related thereto (e.g., metal via V1), may be integrated with a via connection layer (see, e.g., FIG. 1 and FIG. 2).

Figure 3A:
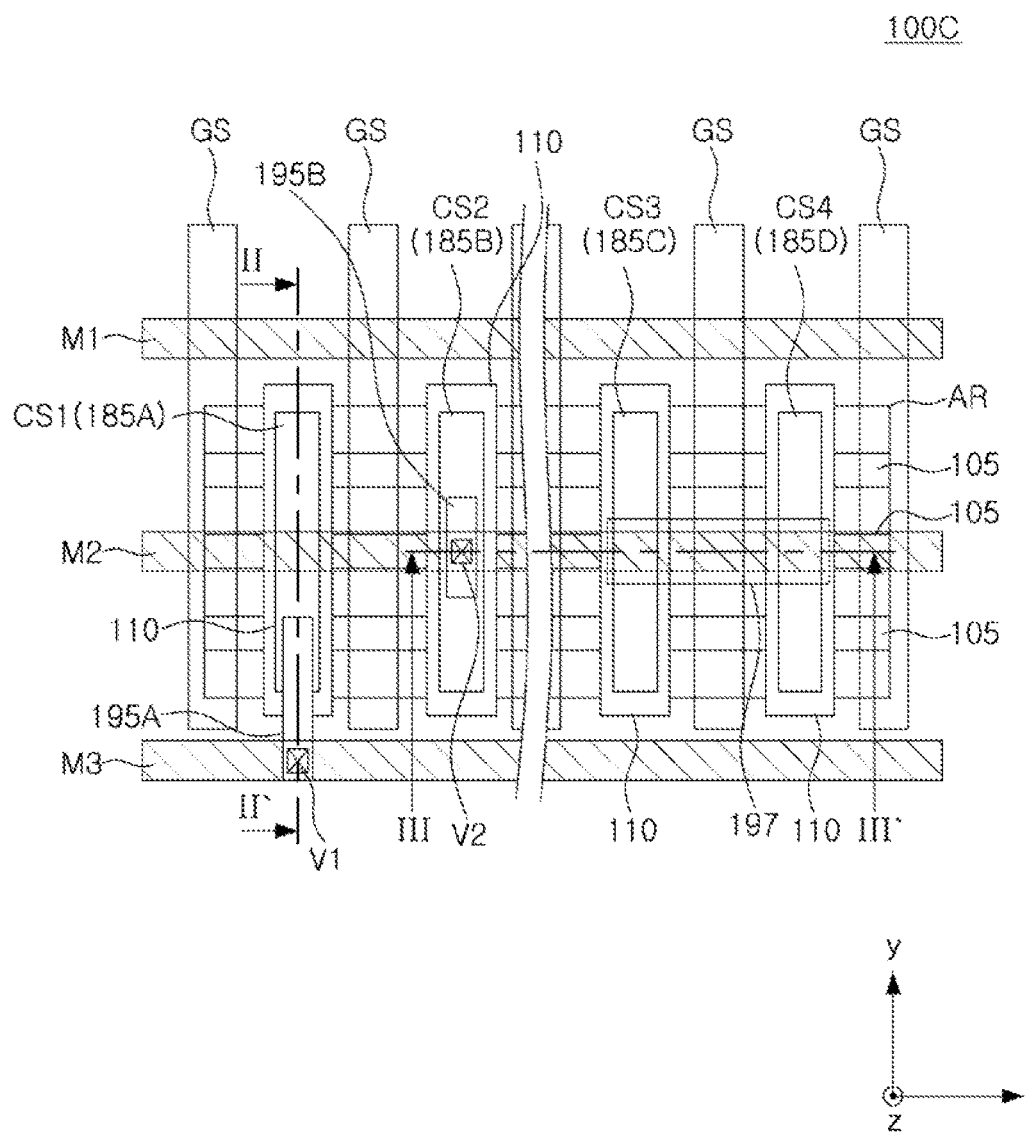
FIG. 3A is a planar layout diagram illustrating a semiconductor device according to an exemplary embodiment of the present inventive concept.
Figure 3B:
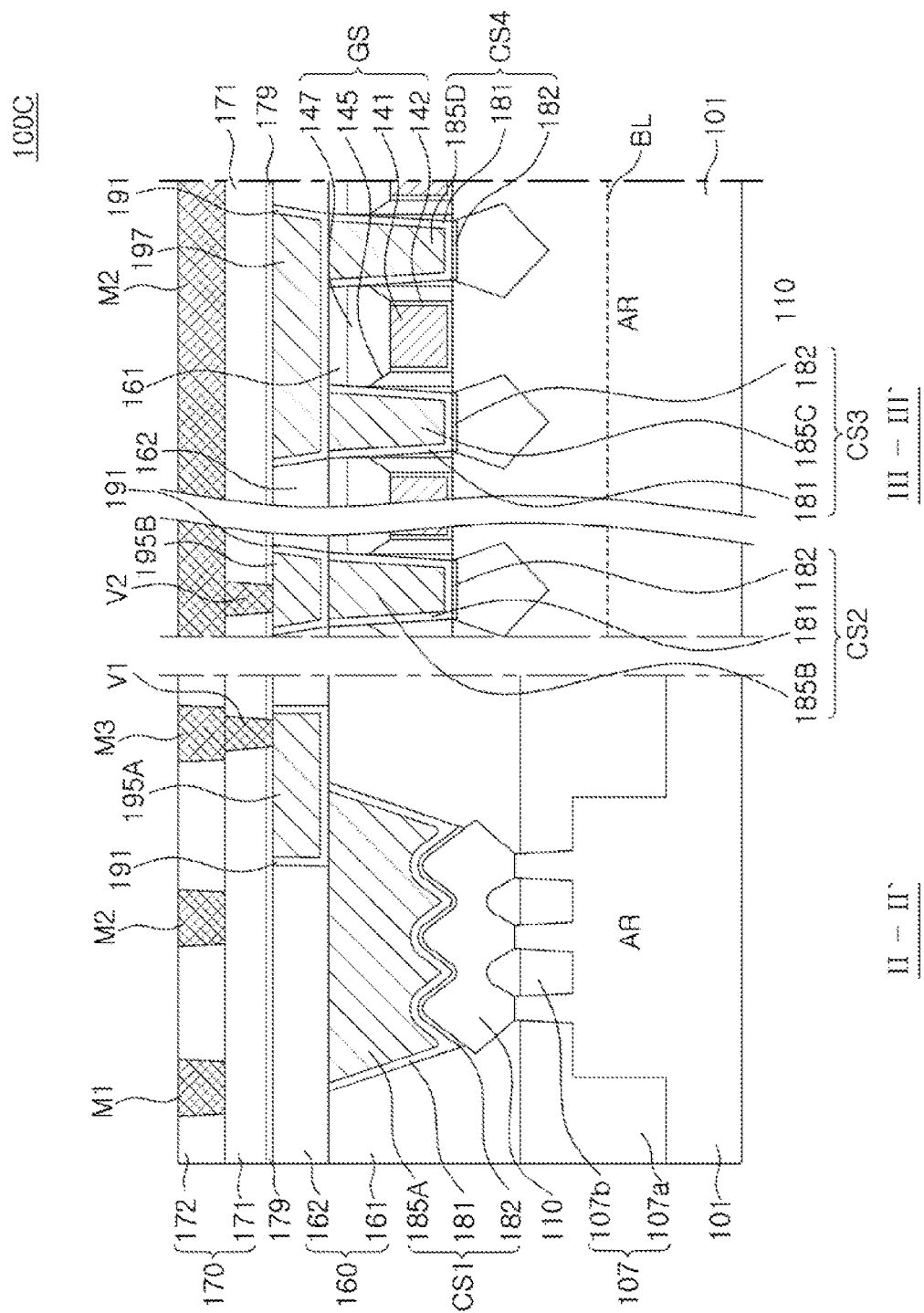
FIG. 3B is a cross-sectional view taken along line II-II' and line III-III' of FIG. 3A.

According to an exemplary embodiment of the present inventive concept, when a metal via related to a contact plug is positioned in a region overlapping the contact plug, the metal via connected to a metal line may be directly connected to a contact plug without an intervening via connection layer. For example, Referring to FIG. 2, the second metal via V2 is directly connected to the second contact plug 185B to allow the fourth metal line M4 to be electrically connected to the second contact plug 185B. Thus, the horizontally extended portion of the first contact plug 185A' and the via connection layer 195' described above with reference to the first contact plug 185' may be omitted in the second contact plug 185B FIG. 3A is a planar layout diagram illustrating a semiconductor device according to an exemplary embodiment of the present inventive concept. FIG. 3B is a cross-sectional view taken along line II-II' and line III-III' of FIG. 3A.

Referring to FIGS. 3A and 3B, a semiconductor device 100C according to an exemplary embodiment of the present inventive concept may include an active region AR defined by the device isolation region 107, the active fin 105 including a plurality of active fins positioned at an upper surface of the active region, and a gate structure GS including a plurality of gate structures and intersecting a region of the active fin. Unless otherwise specified below, the semiconductor device 100C according to an exemplary embodiment of the present inventive concept may be substantially the same as the semiconductor device 100a described above, and thus duplicative descriptions may be omitted below.

The active fin 105 employed in an exemplary embodiment of the present inventive concept is not limited to a particular number of active fins, and thus the active fin 105 may include more or less than three active fins. As an example, the three active fins may be spaced apart from each other at regular intervals in an upper surface of the active region AR to be extended in-parallel in the first direction (e.g., an x direction). The active fin 105 may be provided as an active region of each transistor.

The gate structure GS employed in an exemplary embodiment of the present inventive concept may include a plurality of gate structures (see, e.g., FIG. 3A, in which four gate structures are illustrated), and may be extended in a second direction (e.g., a y direction) intersecting the first direction (e.g., the x direction). The gate structure GS may overlap a portion of the active fin 105 along the direction orthogonal to the upper surface of the substrate 101.

Referring to FIG. 3B, the gate structure GS may include gate spacers 141, a gate dielectric film 142 and a gate electrode 145 sequentially disposed between the gate spacers 141, as well as a gate capping layer 147 disposed on the gate electrode 145.

The gate spacers 141 may include an insulating material such as SiOCN, SiON, SiCN, or SiN. The gate dielectric film 142 may include a silicon oxide film, a high dielectric film, or combinations thereof. The high dielectric film may include a material having a permittivity (for example, about 10 to 25) greater than that of a silicon oxide film. For example, the high dielectric film may include a material selected from hafnium oxide, hafnium oxynitride, hafnium silicon oxide, lanthanum oxide, lanthanum aluminum oxide), or combinations thereof, but exemplary embodiments of the present inventive concept are not limited thereto. The gate dielectric film 142 may be formed using an atomic layer deposition (ALD), a chemical vapor deposition (CVD), or a physical vapor deposition (PVD) process.

The gate electrode 145 may include a first gate electrode controlling a work function and a second gate electrode filling a space formed in an upper portion of the first gate electrode. For example, the first gate electrode may include a metal nitride such as a titanium nitride film (TiN), a tantalum nitride film (TaN), or a tungsten nitride film (WN), and the second gate electrode may include a metal such as aluminum (M), tungsten (W), molybdenum (Mo), or a semiconductor material such as doped polysilicon. The gate capping layer 147 may include an insulating material such as silicon nitride.

The semiconductor device 100C according to an exemplary embodiment of the present inventive concept may include the first contact structure CS1, the second contact structure CS2, the third contact structure CS3, and the fourth contact structure CS4 connected to the source/drain region 110.

The source/drain region 110 may be formed in a portion of the active fin 105 on opposite sides of the gate structure GS. In an exemplary embodiment of the present inventive concept, the source/drain region 110 may be a raised source/drain (RSD).

Each of the first contact structure CS1, the second, contact, structure CS2, the third contact structure CS3, and the fourth contact structure CS4 may be connected to the source/drain region 110 and may pass through the first interlayer insulating layer 161. Each of the first contact structure CS1, the second contact structure CS2, the third contact structure CS3, and the fourth contact structure CS4 may include the metal silicide layer 182, the first conductive barrier 181, as well as the first contact plug 185A, the second contact plug 185B, the third contact plug 185C, and the fourth contact plug 185D.

FIG. 3B is a cross-sectional view taken along line II-II' and line III-III' of the semiconductor device 100C described with reference to FIG. 3A. Referring to FIG. 3B an interconnection structure connects a metal line to a contact plug.

An interconnection structure employed in an exemplary embodiment of the present inventive concept may include a metal via positioned in a contact point of a metal line, and the first via connection layer 195A and the second via connection layer 195B connecting the metal via to the contact plug. A dotted line BL indicates a level of a bottom surface of the active fin 105.

The metal line employed in an exemplary embodiment of the present inventive concept may include the first metal line M1, the second metal line M2, and the third metal line M3, extended in the first direction (e.g., an x direction). The second metal line M2 and the third metal line M3, a portion of the first metal line, the second metal line, and the third metal line, as well as the first contact plug 185A and the second contact plug 185B may be connected to the first metal via V1 and the second, metal via V2 through the first via connection layer 195A and the second via connection layer 195B, respectively. The first metal via V1 and the second metal via V2 may be formed in a contact point of the second metal line M2 and the third, metal line M3.

Referring to FIGS. 3A and 3B, when viewed in a vertical direction (e.g., a z direction), the third, metal line M3 related to the first contact plug 185A may be spaced apart from an upper surface boundary of the active region AR along the direction orthogonal to the upper surface of the substrate 101. As an example, the first metal via V1 positioned in a contact point of the third metal line M3 may be spaced apart from the upper surface boundary of the active region AR along the direction orthogonal, to the upper surface of the substrate 101. A lower surface of the first contact plug 185A may overlap an upper surface of the active region AR along the direction orthogonal to the upper surface of the substrate 101.

In an exemplary embodiment of the present inventive concept, to connect the first contact plug 185A to the first metal via V1, which does not overlap in a vertical direction (e.g., in a z direction), the first via connection layer 195A may extend in a horizontal direction (e.g., a x-y direction). The first via connection layer 195A may be positioned between an upper surface of the first contact plug 185A and a level (e.g., a first level) in which, the first metal via V1 is positioned.

In a different manner from the first contact plug 185A, the second contact plug 185B may be positioned in a region overlapping the second metal via V2 along the direction orthogonal to the upper surface of the substrate 101. In this case, referring to FIG. 3B, the second contact plug 185B may be connected to the second metal via V2 by the second via connection layer 195B. The second via connection layer 1353 may be formed, in the second interlayer insulating layer 162 with the first via connection layer 195A.

The semiconductor device 100C according to an exemplary embodiment of the present inventive concept may include a jumping connection layer 197 connecting the third contact plug 185C to the fourth contact plug 185D connected to source/drain regions 110 of other adjacent devices, with the gate structure GS disposed therebetween. For example, the jumping connection layer 197 may be a node of a static random, access memory (SRAM) device.

The jumping connection layer 197 may be formed at substantially a same level (e.g., a level of the second interlayer insulating layer 162) as the first via connection layer 195A and the second via connection layer 195B. The jumping connection layer 197 employed in an exemplary embodiment of the present inventive concept may be disposed on the first interlayer insulating layer 161 positioned in the gate structure GS. The second conductive barrier 191 may be positioned between the first via connection layer 195A and the second via connection layer 195B, the jumping connection layer 197, as well as the second interlayer insulating layer 162.

The jumping connection layer 197 may be formed with the first via connection layer 195A and the second via connection layer 195B. The first via connection layer 195A and the second via connection layer 195B, as well as the jumping connection layer 197 may include a same material as the first contact plug 185A, the second contact plug 185B, the third contact plug 185C, and the fourth contact plug 185D. For example, the jumping connection layer 197 may include a metal such as W, Co, or Ti.

Figure 4:
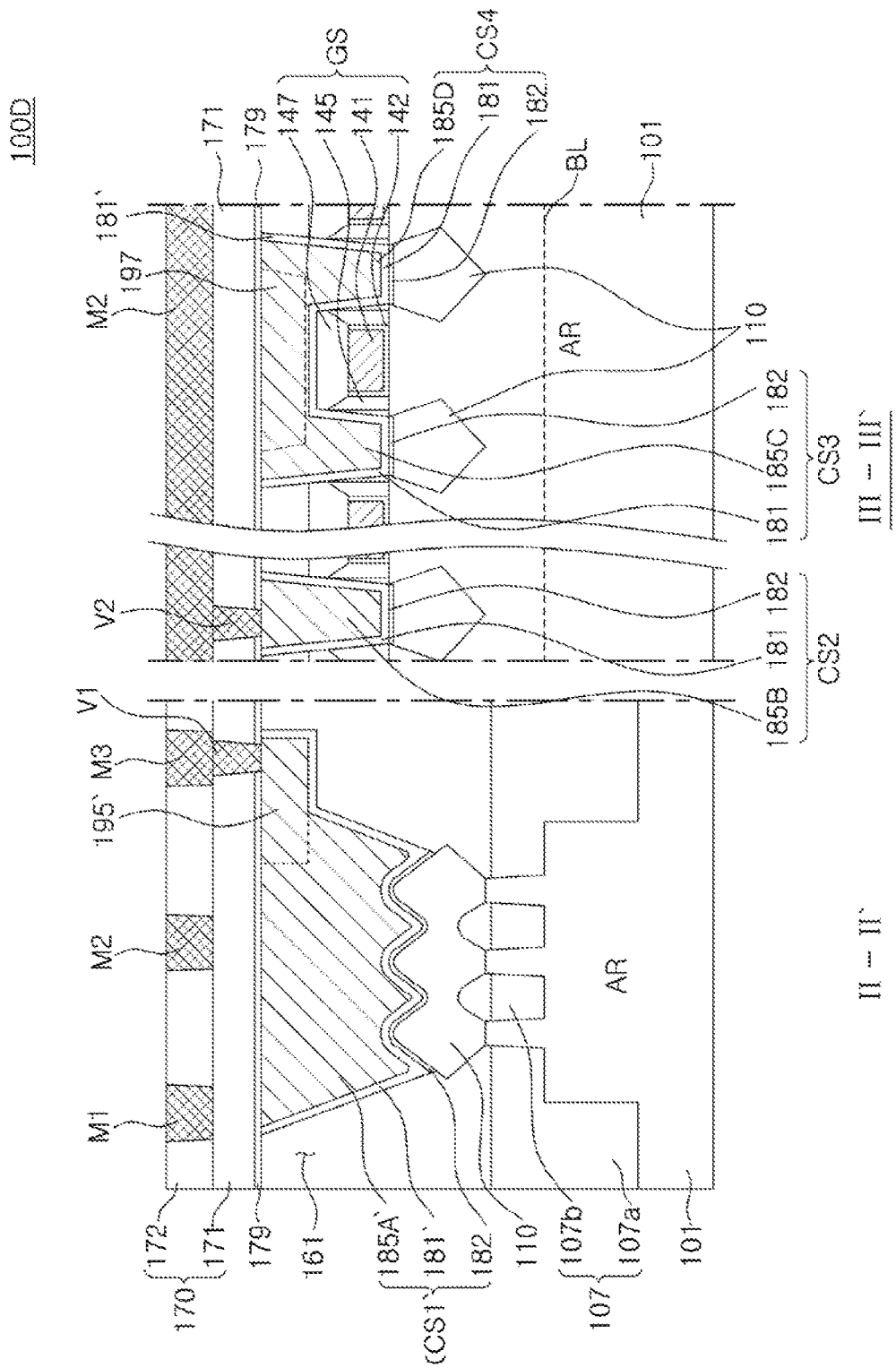
FIG. 4 is a cross-sectional view of a semiconductor device according to an exemplary embodiment of the present inventive concept.

FIG. 4 is a cross-sectional view of a semiconductor device according to an exemplary embodiment of the present inventive concept.

Referring to FIG. 4, a semiconductor device 100D according to an exemplary embodiment of the present inventive concept is similar to the semiconductor device 100C described above with reference to FIG. 3A and FIG. 3B, except that the second interlayer insulating layer (see, e.g., 162 of FIG. 1B) is omitted, the via connection layer 195' is formed in upper ends of the first interlayer insulating layer 161 and the first contact plug 185A', and the jumping connection layer 197 is positioned in an upper surface of the gate capping layer 147. Thus, duplicative descriptions may be omitted below. For example, a layout of the semiconductor device 100C described above with reference to FIG. 3A and FIG. 3B and the description thereof may be applied to the semiconductor device 100D described in more detail below.

The via connection layer 195' according to an exemplary embodiment of the present inventive concept may be formed to be integrated with the first contact plug 185A' along an upper region of the first interlayer insulating layer 161 in a manner similar to that described with referenced to FIG. 2. The first contact plug 185A' integrated with the via connection layer 195' may include the single conductive barrier 181'. The via connection layer 195' and the first contact plug 185A' may be formed using a single filling process. The first contact plug 185A' may have an upper surface substantially coplanar with an upper surface of the via connection layer 195' (see, e.g., FIGS. 8 through 12). In an exemplary embodiment of the present inventive concept, the contact structure CS1' may be integrated with the via connection layer 195'.

The second contact plug 185B may be directly connected to the second metal via V2 without a via connection layer.

Thus, the second contact plug 185B may be electrically connected to the second metal line M2, and a via connection layer may be omitted.

The jumping connection layer 197' employed in an exemplary embodiment of the present inventive concept may be formed at substantially a same level as the via connection layer 195', and thus may be disposed along an upper surface of the gate structure GS. Referring to FIG. 4, the jumping connection layer 197' may be positioned in an upper surface of the gate capping layer 147. The jumping connection layer 197' employed in an exemplary embodiment of the present inventive concept may be formed, with the third, contact plug 185C and the fourth contact plug 185D. Thus, in a manner similar to the contact structure CS1' integrated with the via connection layer 195', the jumping connection layer 197' as well as the third contact plug 185C and the fourth contact plug 1850 may be formed using a single filling process, and may have a single conductive barrier 181'. Thus, a conductive barrier material need not be present between the via connection layer 195' and the first contact plug 185A', and between the jumping connection layer 197' and each of the third contact plug 185C and the fourth contact plug 185D.

FIGS. 5 through 7 are drawings illustrating a method of manufacturing a semiconductor device according to an exemplary embodiment, of the present inventive concept. FIGS. 5 through 7 are cross-sectional views illustrating an operation of forming an interconnection structure in the semiconductor device 100A described with reference to FIG. 1B.

Referring to FIG. 5, a semiconductor device is provided including the first contact structure CS1 and the second contact structure CS2 before the second, interlayer insulating layer 162 is formed.

After a plug material for the first contact structure CS1 and the second contact structure CS2 is filled, a chemical mechanical polishing process may be performed, and thus upper surfaces of the first contact structure CS1 and the second contact structure CS2 may be substantially coplanar with an upper surface of the first interlayer insulating layer 161. Lower surfaces of the first contact plug 185A and the second contact plug 185B may be formed to be positioned within upper surface boundaries of the first active region AR1 and the second active region. AR2, respectively.

Referring to FIG. 6, the second interlayer insulating layer 162 may be formed, on the first interlayer insulating layer 161, and the first via connection layer 195a and the second via connection layer 195b may be formed in the second, interlayer insulating layer 162.

The second interlayer insulating layer 162 may be formed on the first interlayer insulating layer 161. As an example, the second interlayer insulating layer 162 may include TEOS, USG, PSG, BSG, BPSG, FSG, SOG, TOSZ or combinations thereof, and may be formed, using a chemical vapor deposition (CVD) or spin coating process. The second interlayer insulating layer 162 may include a same material as the first interlayer insulating layer 161.

A photolithography process may be used to form open areas for the first via connection layer 195a and the second via connection layer 195b in the second interlayer insulating layer 162. For example, an open area for the first via connection layer 195a may be formed to be extended to a contact point (e.g., the first metal via V1) with a metal line spaced apart from an upper surface boundary of the first active region AR1 along the direction orthogonal to the upper surface of the substrate 101. The second conductive barrier 191 and the first via connection layer 195A may be formed in an open area.

Referring to FIG. 7, a first open area Oa and a second open area Ob may be formed in the first low dielectric layer 171 and the second low dielectric layer 172, respectively.

The first low dielectric layer 171 and the second low dielectric layer 172 may be sequentially formed on the second interlayer insulating layer 162. The first open area Oa connected to the first via connection layer 195A may be formed in the first low dielectric layer 171 and the second low dielectric layer 172, and the second open area Ob for a metal line may be formed in the second low dielectric layer 172. The first open area Oa and the second open area Ob may be filled with a metal and a CMP process is applied thereto, so a desired metal via and a desired metal line may be formed.

FIGS. 8 through 12 are drawings illustrating a method, of manufacturing a semiconductor device according to an exemplary embodiment of the present inventive concept. FIGS. 8 through 12 are cross-sectional views illustrating an operation of forming an interconnection structure in the semiconductor device described with reference to FIG. 2.

Figure 8:
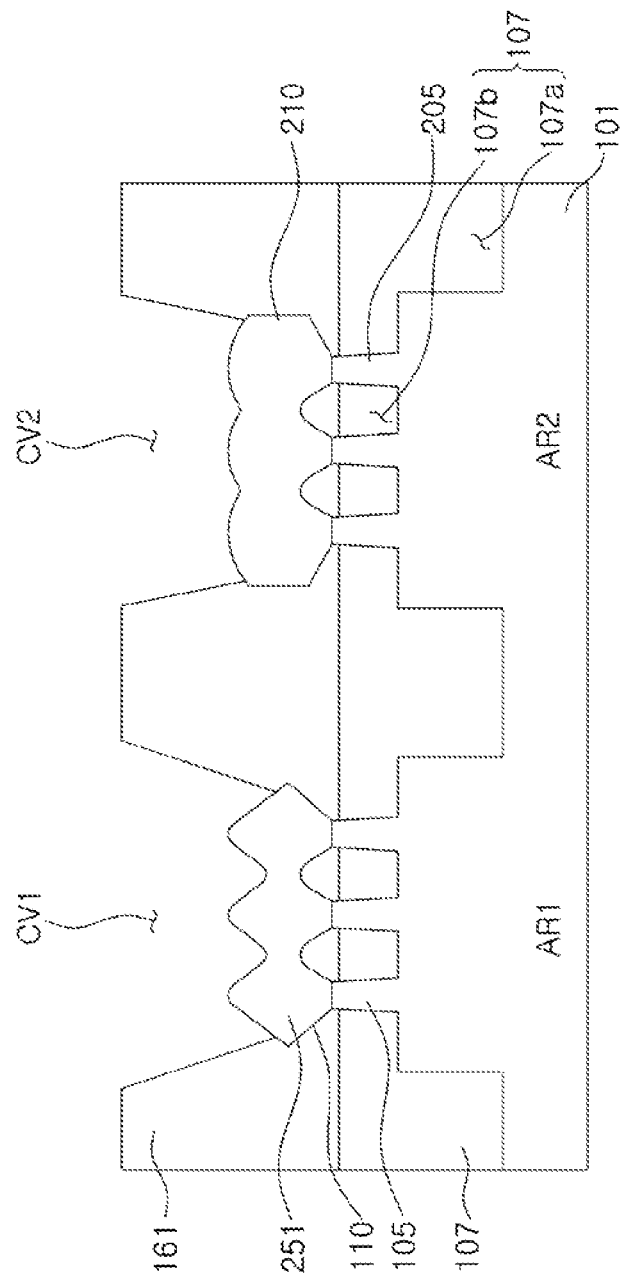
FIGS. 8 through 12 are drawings illustrating a method of manufacturing a semiconductor device according to an exemplary embodiment of the present inventive concept.

Referring to FIG. 8, a first contact hole CV1 and a second contact hole CV2 may be formed in the first interlayer insulating layer 161.

The first contact hole CV1 and the second contact hole CV2 may pass through the first interlayer insulating layer 161 to be connected, to the first source/drain region 110 and the second source/drain region 210, respectively. The first contact hole CV1 and the second contact hole CV2 may be formed, using a photolithography process.

Figure 9:
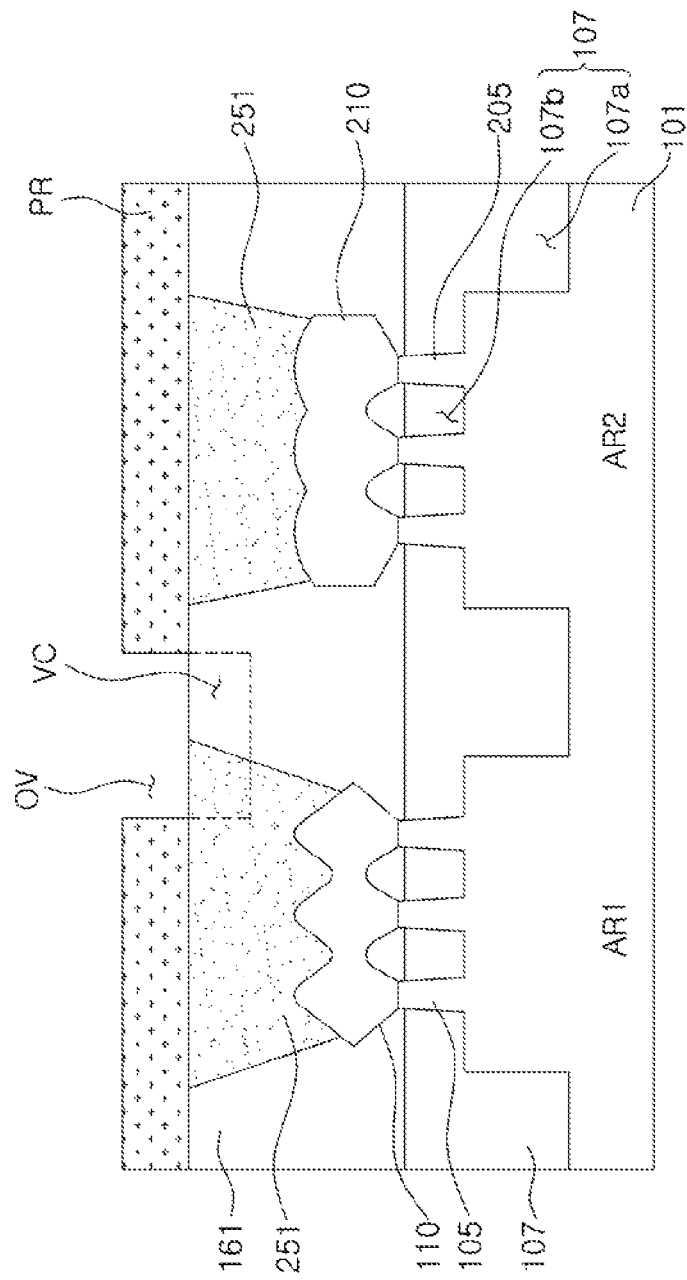

Referring to FIG. 9, a selective etching process forming a via connection region VC extended from the first contact hole CV1 may be performed.

Figure 10:
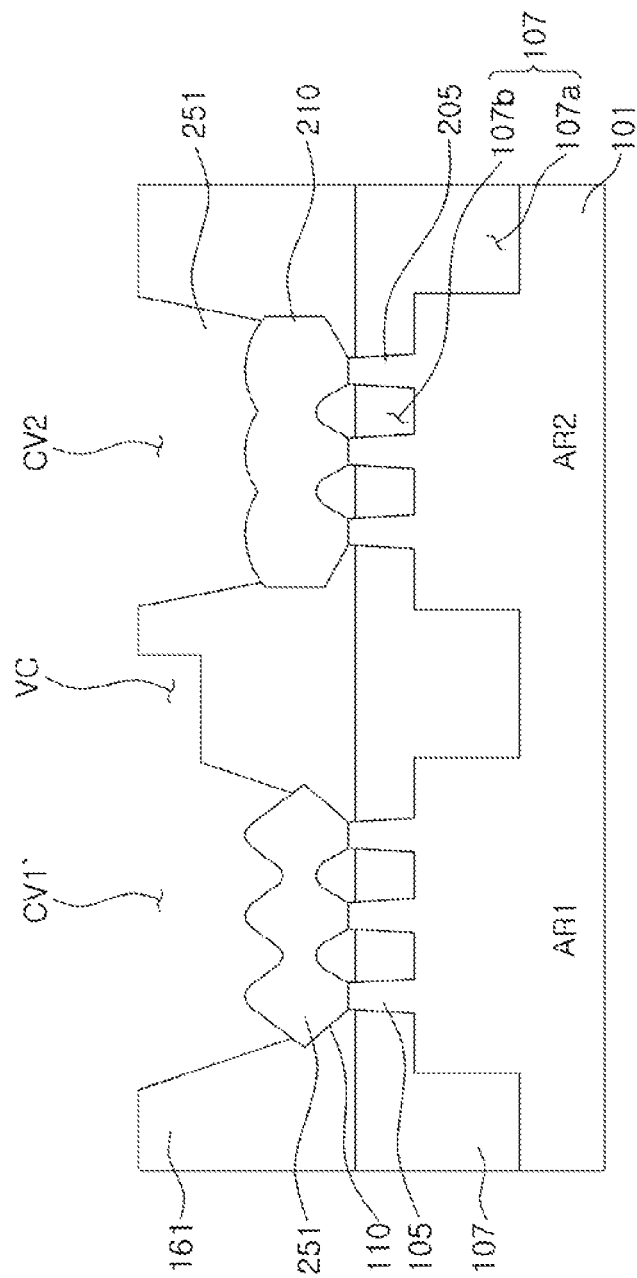

The selective etching process may be performed before an operation of forming a contact structure CS1'. The contact structure CS1' may be subsequently formed, for example, by a barrier forming and filling operation. The first contact hole CV1 and the second contact hole CV2 may be filled with a hard mask material 251 such as a Spin-On Hardmask (SOH). Next, a photoresist, film PR may be formed on the interlayer insulating layer 161, and an opening OV for the via connection region VC may be formed in the photoresist film PR. Referring to FIG. 10, after the photoresist film PR and the hard mask material 251 are removed, a first contact hole CV1' extended, to the via connection region VC may be formed.

Figure 11:
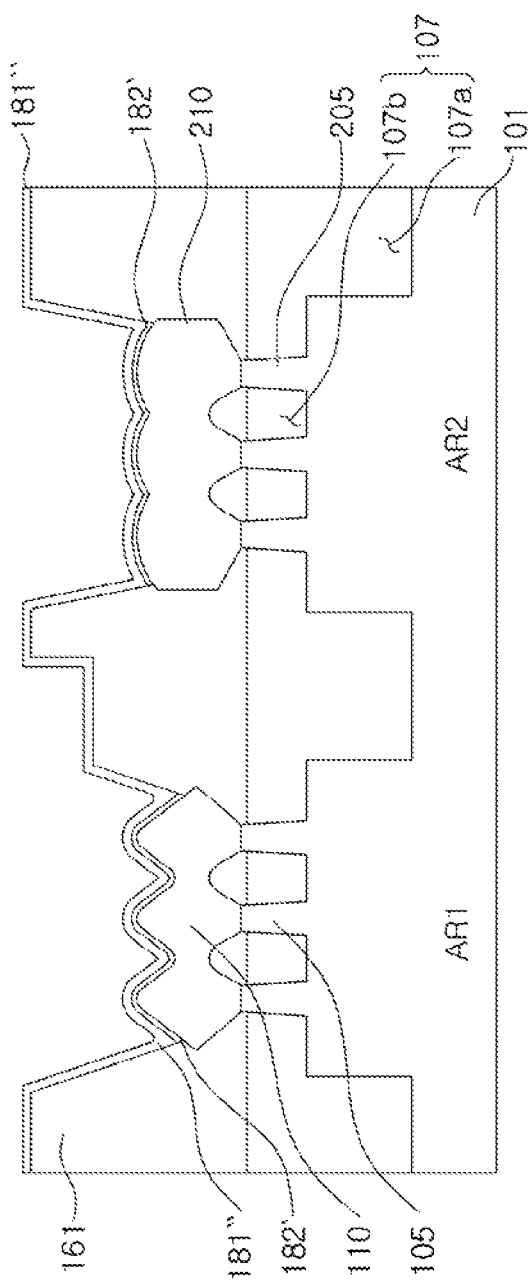

Referring to FIG. 11, after the hard mask material is removed, a metal layer 182' and a barrier material layer 181" may be formed in the first contact hole CV1', having been extended, and the second contact hole CV2.

The metal layer 182' may include a metal or metal silicide. For example, the metal may include Ti, Co, Ni, Ta, Pt, or combinations thereof. The metal layer 182' may be formed using a PVD process.

The barrier material layer 181" may be conformally formed in inner surfaces of the first contact hole CV1', having been extended, and the second contact hole CV2, as well as an upper surface of the interlayer insulating layer 161. An operation described above may be performed using a PVD, CVD, or ALD process. For example, the barrier material layer 181" may include TiN, TaN, AlN, WN, or combinations thereof.

Figure 12:
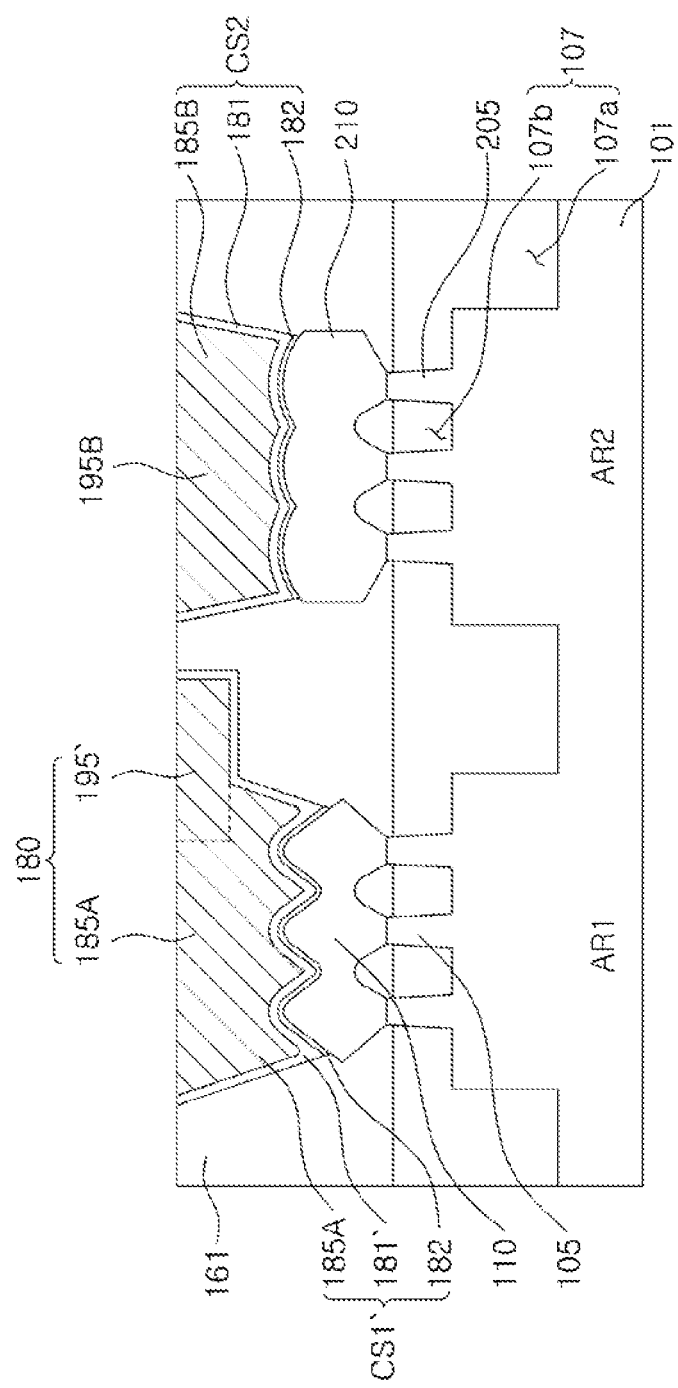

Referring to FIG. 12, the metal silicide layer 182 is formed from the metal layer 182', and the first contact hole CV1', having been extended, and the second contact hole CV2 are filled with a conductive material, so the first contact plug 185A and the second contact plug 185B may be formed.

The metal silicide layer 182 may be formed, as the metal layer 182' is heat-treated and thus reacts with a semiconductor material of the first source/drain region 110 and the second source/drain region 210. A heat treatment process described above may performed using, for example, laser annealing. For example, the conductive material may include W, Cu, Ti, alloys thereof, or combinations thereof.

The first contact plug 185A employed in an exemplary embodiment of the present inventive concept may be formed as a contact plug 180 integrated with the via connection layer 195' for connection to a metal via. Thus, the metal via connected with the via connection layer 195' may be spaced apart from (i.e., does not overlap) the first active region AR1 along the direction orthogonal to the upper surface of the substrate 101.

After filling a conductive material, until a portion of the barrier material layer 181", positioned in an upper surface of the interlayer insulating layer 161 is removed, a polishing process such as a CMP process may be performed. Thus, an upper surface of the contact plug 180 including the first contact plug 185A', having been extended by the via connection layer 195', may be substantially coplanar with an upper surface of the interlayer insulating layer 161, and the conductive barrier 181' for the contact structure CS1' and the first conductive barrier 181 for the contact structure CS2 may be formed (see, e.g., FIG. 12).

A via connection layer for connecting a contact plug to a metal line (e.g., a metal via) of a BEOL may be designed to have various routings. The via connection layer may have portions extended in different directions, and may be formed to have various shapes, for example an I, L, T or an H-shape. The via connection layer may be used as a via connection layer for connecting two or more contacts to a single metal via at the same time. A via connection layer having various shapes employed in exemplary embodiments of the present inventive concept will be described in more detail below with reference to FIGS. 13A and 14.

Figure 13A:
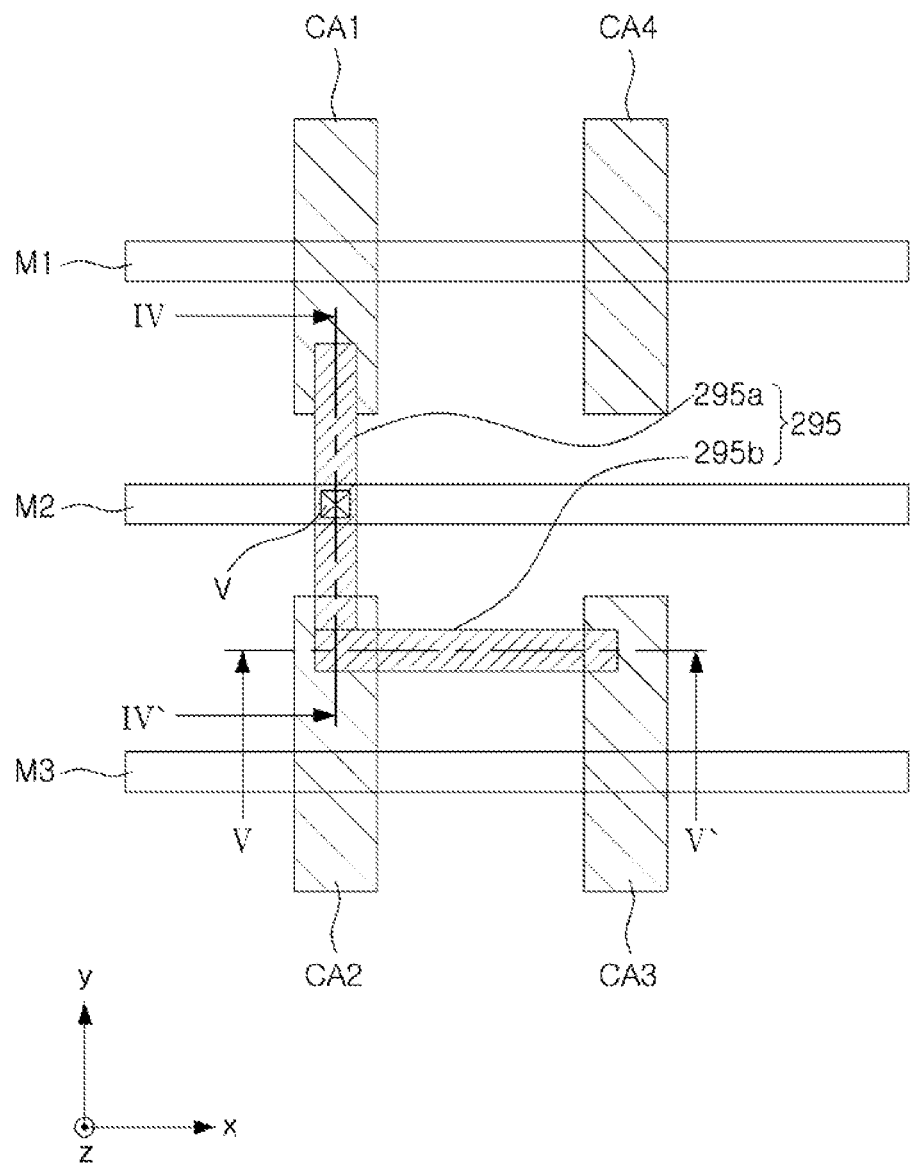
FIG. 13A is a planar layout diagram illustrating a semiconductor device according to an exemplary embodiment of the present inventive concept.

FIG. 13A is a planar layout diagram, illustrating a semiconductor device according to an exemplary embodiment of the present inventive concept. A contact plug and a metal line are illustrated in FIG. 13A to describe a shape of the via connection layer.

Referring to FIG. 13A, a semiconductor device according to an exemplary embodiment or the present inventive concept may include a first contact plug CA1, a second contact plug CA2, a third contact plug CA3, and a fourth contact plug CA4, as well as the first metal line M1, the second metal line M2, and the third metal line M3.

A via connection layer 295 employed in an exemplary embodiment of the present inventive concept may allow the first contact plug CA1, the second contact plug CA2, and the third contact plug CA3 among four contact plugs to commonly connected to a metal via V of the second metal line M2. The via connection layer 295 may include a first portion 295a extended to one direction (e.g., a y direction), and a second portion 295b extended in another direction (e.g., an x direction) intersecting the one direction.

Figure 13B:
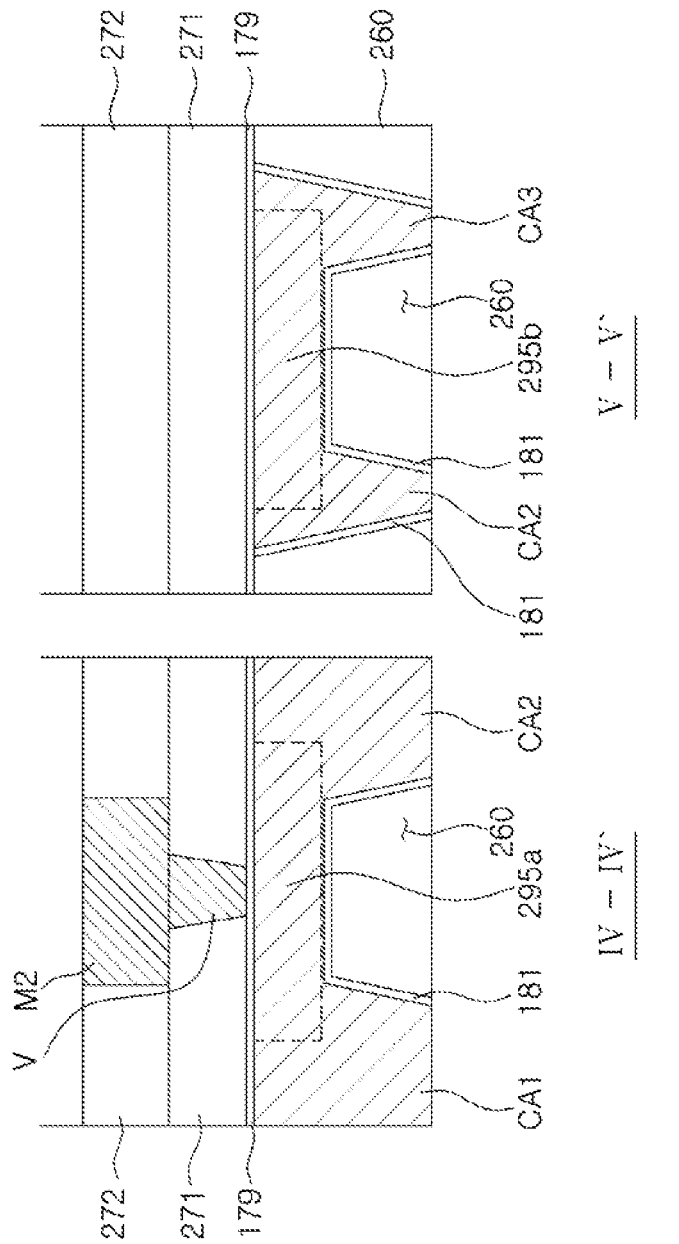
FIG. 13B is a cross-sectional view taken along line IV-IV' and line V-V of FIG. 13A.

FIG. 133 is a cross-sectional view taken along line IV-IV' and line V-V' of FIG. 13A. FIG. 13B illustrates a structure in which a via connection layer is formed without the introduction of an additional interlayer insulating layer, such as in the exemplary embodiments of the present inventive concept described in more detail with reference to FIGS. 2 and 4.

Referring to FIG. 13B, the first portion 295a may be formed to connect the first contact plug CA1 to the second contact plug CA2 on an interlayer insulating layer 260, and may be connected to the metal via V formed in a first low dielectric layer 271. The metal via V may be connected to the second metal line M2 formed in a second low dielectric layer 272. The second portion 295b may be extended from an end of the first portion 295a (e.g., along an extending direction perpendicular to an extending direction of the first portion 295a), and may be connected to the second contact plug CA2 and the third contact plug CA3.

The first portion 295a and the second portion 295b forming a via connection layer according to an exemplary embodiment of the present inventive concept may be formed using a single photolithography process and a single etching process. However, to obtain a more precise profile in a portion in which the first portion 295a intersects the second, portion 295b, the first portion. 295a and the second portion 295b may be formed using a separate photolithography process and a separate etching process (see, e.g., FIGS. 15 through 19).

Figure 14:
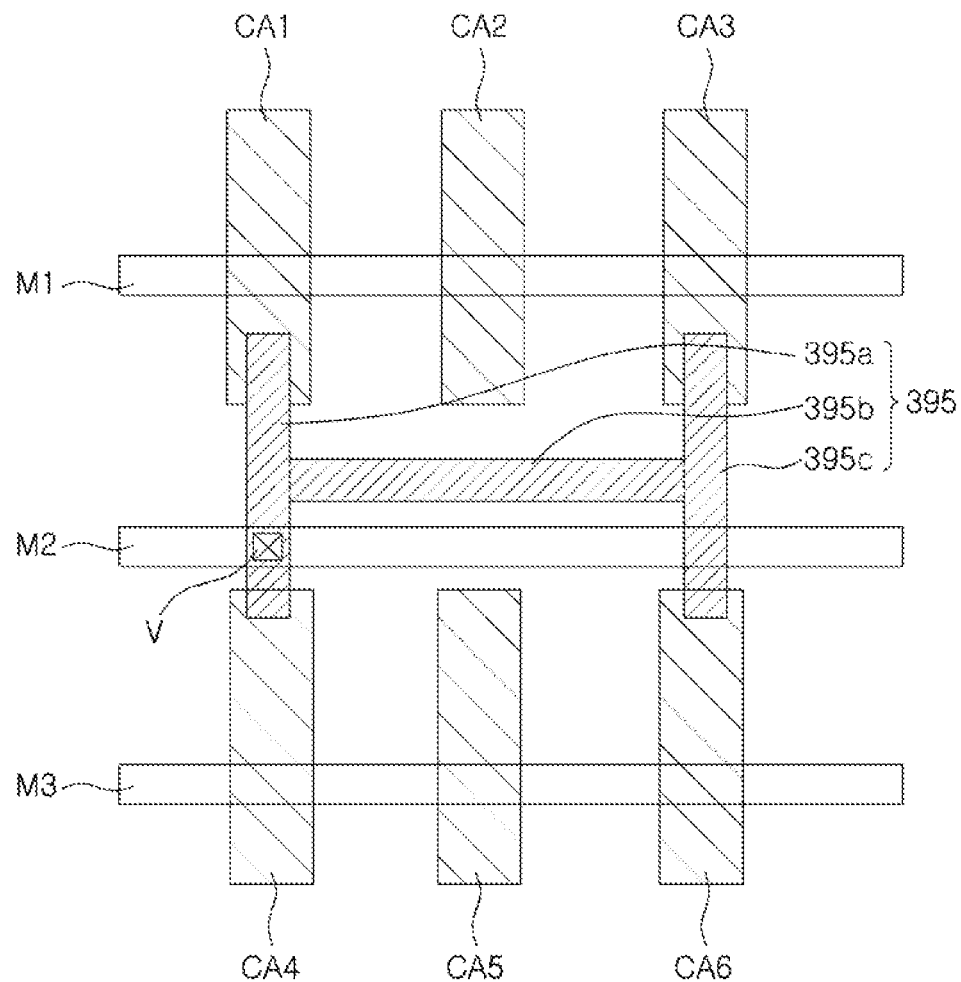
FIG. 14 is a planar layout diagram illustrating a semiconductor device according to an exemplary embodiment of the present inventive concept.

FIG. 14 is a planar layout diagram illustrating a semiconductor device according to an exemplary embodiment of the present inventive concept.

Referring to FIG. 14, a semiconductor device according to an exemplary embodiment of the present inventive concept may include a first contact plug CA1, a second, contact plug CA2, a third contact plug CA3, a fourth contact, plug CA4, a fifth contact plug CA5, and a sixth contact plug CA6, as well as a first metal line M1, a second metal line M2, a third metal line M3.

A via connection layer 395 employed in an exemplary embodiment of the present inventive concept may allow the first contact plug CA1, the third contact plug CA3, the fourth contact plug CA4, and the sixth contact plug CA6 to be commonly connected to a metal via V of the second metal line M2. The via connection layer 395 may include a first portion 395a and a third portion 395c extended in one direction (e.g., a y direction), and a second portion 395b extended in another direction (e.g., an x direction) intersecting the one direction. The first portion 395a allows the first contact plug CA1 and the fourth contact plug CA4 to be connected to each other with the metal via V, and the third portion 395c allows the third contact plug CA3 and the sixth contact plug CA6 to be connected to each other. Both ends of the second portion 395b may be connected to the first portion 395a and the third portion 395c, respectively, thus allowing the first contact plug CA1, the third contact plug CA3, the fourth contact plug CA4, and the sixth contact plug CA6 to be commonly connected to the second metal line M2.

FIGS. 15 through 19 are drawings illustrating a method of manufacturing a semiconductor device according to an exemplary embodiment of the present inventive concept. For example, FIGS. 15 through 19 are drawings illustrating a method of manufacturing the semiconductor device described with reference to FIG. 13B.

Figure 15:
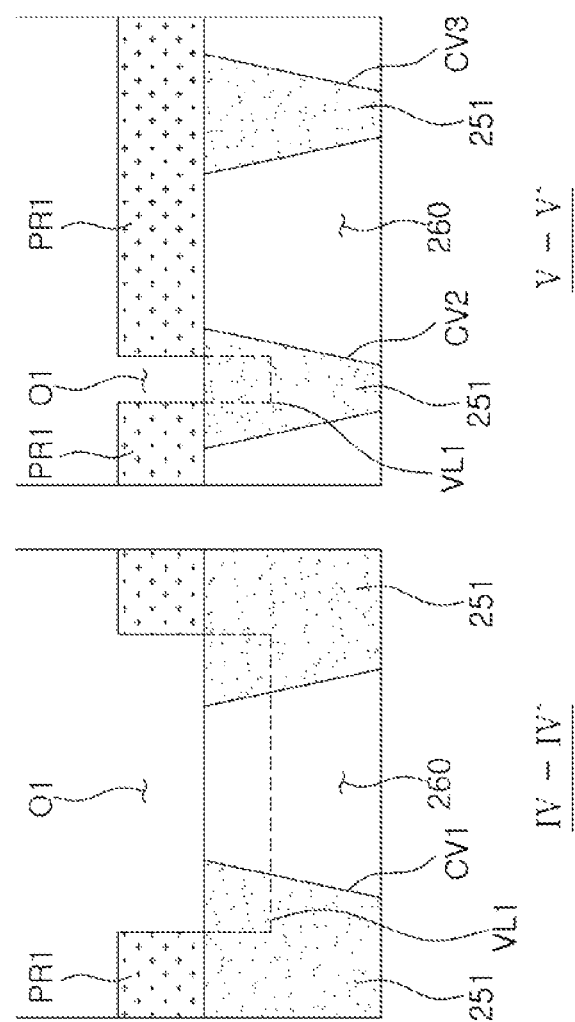
FIGS. 15 through 19 are drawings illustrating a method of manufacturing a semiconductor device according to an exemplary embodiment, of the present inventive concept.

Referring to FIG. 15, a contact hole CV1, a second contact hole CV2, and a third contact hole CV3 may be formed, and may then be filled with a first hard mask material 251. A first photoresist film PR1 having an opening O1 for formation of the first portion (e.g., 295a described with reference to FIGS. 13A and 13B) of a via connection layer may be formed thereafter.

Figure 16:
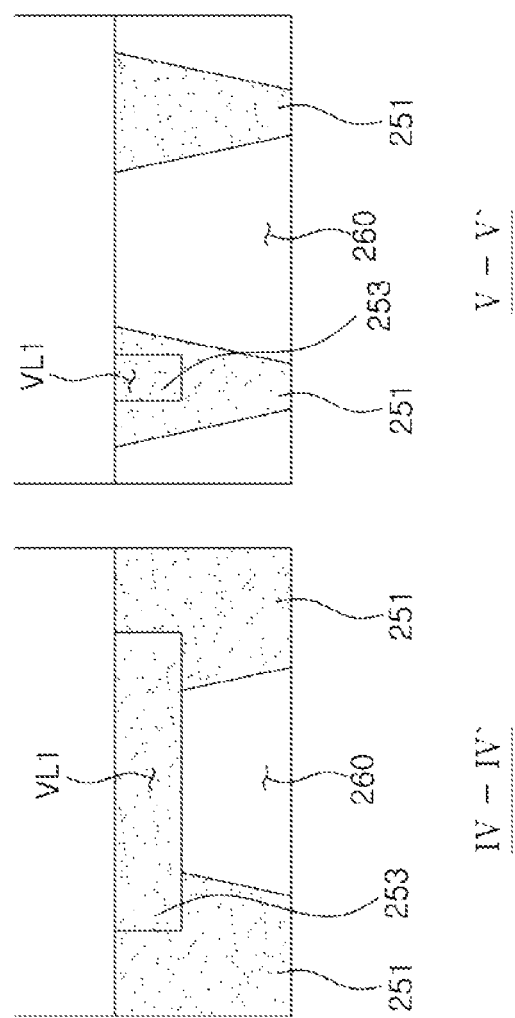

Referring to FIG. 16, the first photoresist film PR1 may be used to additionally etch a region VL1 corresponding to the first portion 295a indicated by a dotted line, and the region VL1 corresponding to the first portion 295a may be filled with a second, hard mask material 253.

A region selectively etched in an operation described, above may include not only a portion of the first hard mask material 251 with which the first contact hole CV1 and the second contact, hole CV2 are filled, but also a portion of the interlayer insulating layer 260 positioned between the first contact hole CV1 and the second contact hole CV2.

Figure 17:
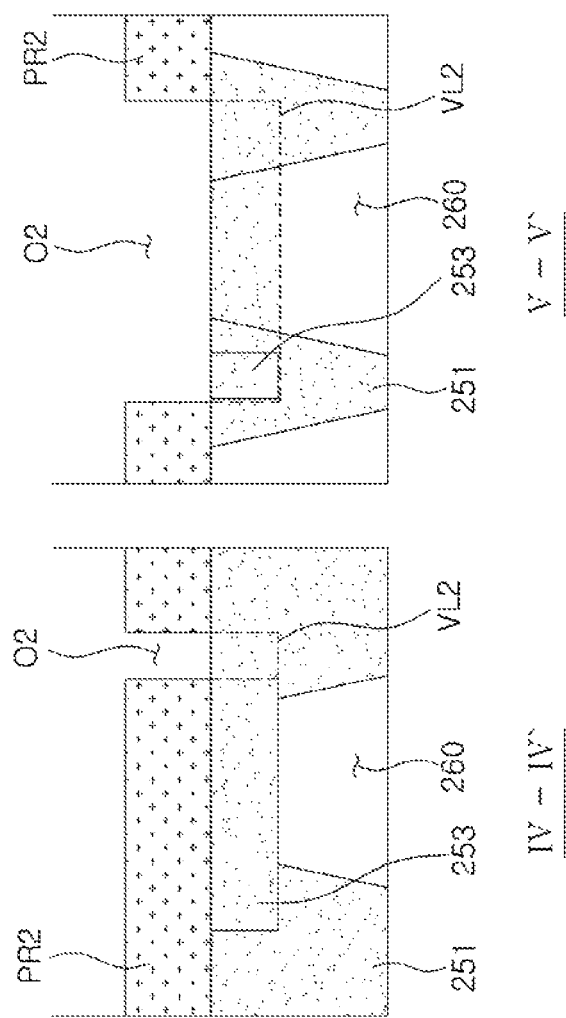

Referring to FIG. 17, a second photoresist film PR2 having an opening O2 for formation of the second portion 295b of a via connection layer may be formed. To connect the first portion 295a to the second portion 295b to be formed in a subsequent process, a region VL2 corresponding to the second portion 295b may be formed, to overlap the region VL1 corresponding to the first portion 295a along the direction orthogonal to the upper surface of the substrate 101.

Figure 18:
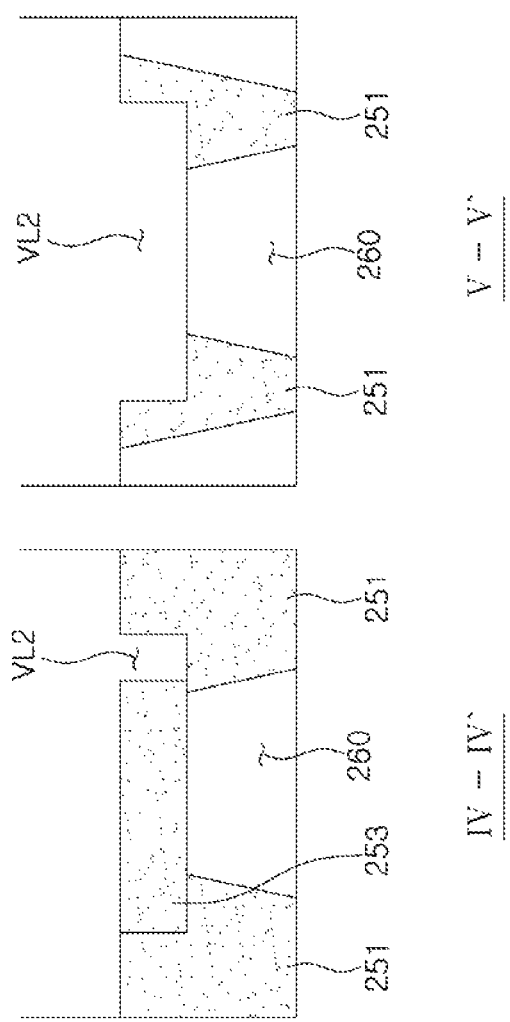

Referring to FIG. 18, the second photoresist film PR2 may be used, to additionally etch a region corresponding to the second portion 295b of a via connection layer, and the second photoresist film PR2 may be removed.

Figure 19:
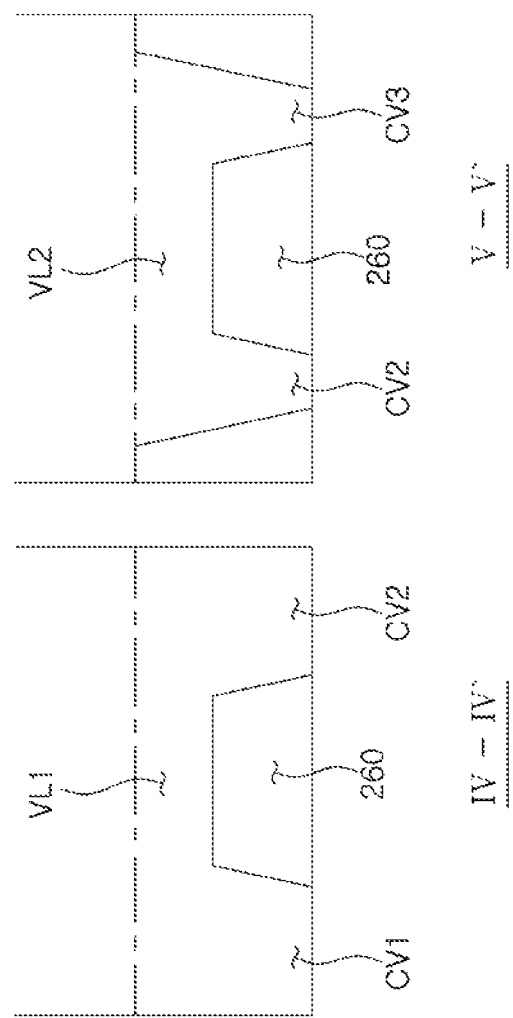

Referring to FIG. 19, the first hard mask material 251 and the second hard mask material 253 remaining on the first contact hole CV1, the second contact hole CV2, and the third contact hole CV3, may be removed, so the first contact hole CV1, the second contact hole CV2, and the third contact hole CV3 connected by the region VL1 corresponding to the first portion and the region VL2 corresponding to the second portion may be formed. The first contact hole CV1, the second contact hole CV2, and the third contact hole CV3 connected as described above may be filled with a conductive barrier layer and a conductive material, so a contact plug structure connected by the first portion 295a and the second portion 295b of the via connection layer described with reference to FIG. 13B may be formed.

Figure 20:
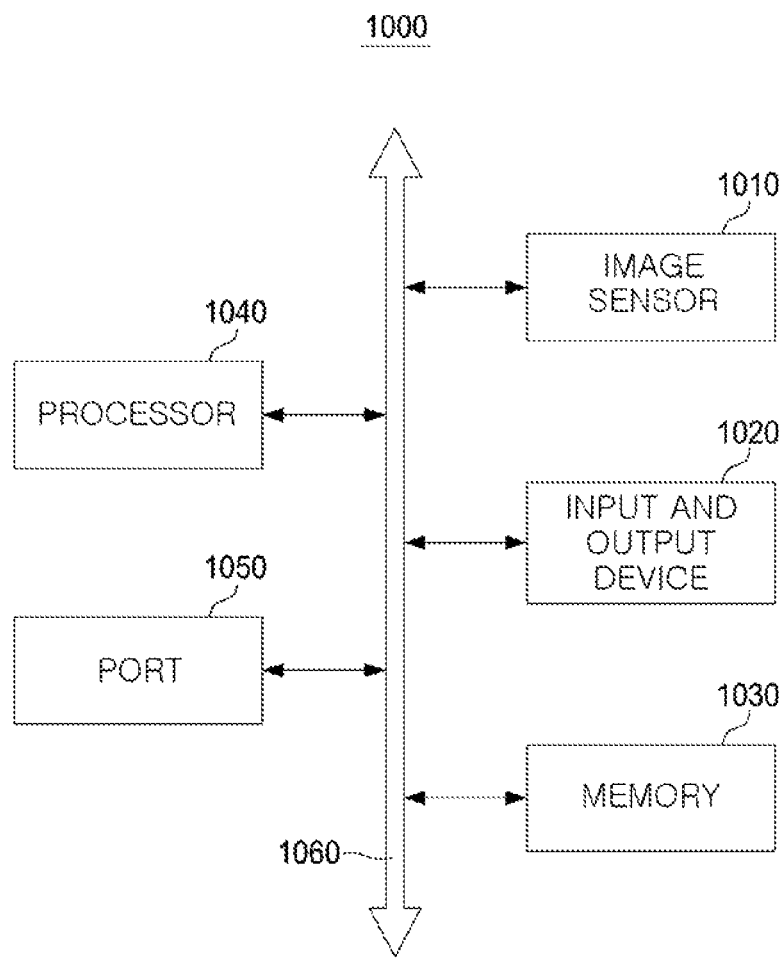
FIG. 20 is a block diagram illustrating an electronic device in which a semiconductor device according to an exemplary embodiment of the present inventive concept is employed as a memory device.

FIG. 20 is a block diagram illustrating an electronic device in which a semiconductor device according to an exemplary embodiment of the present inventive concept is employed as a memory device.

Referring to FIG. 20, an electronic device 1000 may include an image sensor 1010, an input and output device 1020, a memory device 1030, and a processor 1040, configured to communicate via a bus 1060.

Among components described with reference to FIG. 20, a port 1050 may be a device configured to allow the electronic device 1000 to communicate with a video card, a sound card, a memory card, or a USB device. The electronic device 1000 may include, for example, a general desktop computer or a laptop computer, as well as a smartphone, a tablet PC, or a wearable smart device.

The processor 1040 may be configured perform specific operations, commands, or tasks. The processor 1040 may be a central processing unit (CPU) or a microprocessor unit (MCU), and may communicate with other devices connected to the memory device 1030, the input and output device 1020, the image sensor 1010, and the port 1050 through the bus 1060.

The memory device 1030 may be a storage medium storing data, such as multimedia data, used for an operation of an electronic device 1000 such as a computer. The memory device 1030, as a semiconductor device according to an exemplary embodiment of the present inventive concept, may include at least one of a memory such as SRAM, or a solid state drive (SSD) including the same, a hard disk drive (HDD), and an optical drive (ODD). The input and output device 1020 may include an input device such as a keyboard, a mouse, and a touch screen, provided for a user, as well as an output device such as a display, and an audio output portion.

The image sensor 1010 may have a sensor circuit having a plurality of transistors, and a semiconductor device forming the sensor circuit, may have the interconnection structure described above according to an exemplary embodiment of the present inventive concept.

As set forth above, according to an exemplary embodiment of the present inventive concept, as a via connection layer connecting a contact plug to a metal line (e.g., a metal via) of a BEOL, positioned in different regions, in a horizontal direction is introduced, an occurrence of a short defect with other adjacent components (e.g., a source/drain of another adjacent device) may be reduced or eliminated, and a sufficient margin may be formed when an interconnection structure is formed.

A via connection layer employed in an exemplary embodiment of the present inventive concept may be formed with a node contact of a static random access memory (SRAM). An exemplary embodiment of the present inventive concept may also be employed in an interconnection structure in which various routings are employed.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor device, comprising:
    a substrate having a device isolation region defining an active region;
    an active fin positioned in the active region and extended in a first direction;
    a gate structure overlapping the active fin along a direction orthogonal to an upper surface of the substrate and extended in a second direction intersecting the first direction;
    a source/drain region disposed on the active fin;
    a contact plug connected to the source/drain region, and overlapping the active region along the direction orthogonal to the upper surface of the substrate;
    a metal via positioned at a first level above the substrate, higher than an upper surface of the contact plug, and spaced apart from the active region along the direction orthogonal to the upper surface of the substrate, wherein the metal via does not overlap the contact plug along the direction orthogonal to the upper surface of the substrate;
    a metal line positioned at a second level above the substrate, higher than the first level, and connected to the metal via; and
    a via connection layer extended from an upper portion of the contact plug and connected to the metal via.

2. The semiconductor device of claim 1, wherein the via connection layer is positioned at a level between the upper surface of the contact plug and the first level.

3. The semiconductor device of claim 2, further comprising:
    a first conductive barrier disposed on a side surface and a lower surface of the contact plug, and a second conductive barrier disposed on a side surface and a lower surface of the via connection layer,
    wherein a portion of the second conductive barrier is positioned between the contact plug and the via connection layer.

4. The semiconductor device of claim 1, wherein the upper surface of the contact plug is substantially coplanar with an upper surface of the via connection layer.

5. The semiconductor device of claim 1, wherein the via connection layer is integrated with the contact plug.

6. The semiconductor device of claim 5, wherein the via connection layer includes a same material as a material included in the contact plug.

7. The semiconductor device of claim 1, wherein the via connection layer is positioned at substantially a same level as an upper surface of the gate structure.

8. The semiconductor device of claim 1, wherein the contact plug includes a first contact plug and a second contact plug connected to the source/drain region provided as source/drain regions, respectively, with the gate structure positioned therebetween,
    and wherein the contact plug further includes a jumping connection layer positioned at substantially a same level as the via connection layer, and connecting the first contact plug to the second contact plug.

9. The semiconductor device of claim 1, wherein the via connection layer includes a first portion extended in one direction and a second portion extended in another direction intersecting the one direction.

10. The semiconductor device of claim 1, wherein the contact plug includes a plurality of contact plugs, and
    the via connection layer is commonly connected to an upper portion of the plurality of contact plugs and extended to the metal via.

11. The semiconductor device of claim 1, wherein the via connection layer and the contact plug are formed of a same material.

12. The semiconductor device of claim 11, wherein the via connection layer and the contact plug each include tungsten (W), cobalt (Co), titanium (Ti), alloys thereof, or a combinations thereof.

13. The semiconductor device of claim 1, further comprising
    an additional metal via positioned at the first level, higher than the upper surface of the contact plug, and positioned at the upper surface of the active region along the direction orthogonal to the upper surface of the substrate,
    an additional metal line positioned at the second level, higher than the first level, and connected to the metal via, and
    an additional via connection layer connecting the additional metal line to the metal line.

14. The semiconductor device of claim 1, wherein the metal via is spaced apart from the source/drain region along a direction parallel to the upper surface of the substrate.

15. A semiconductor device, comprising:
    an active region having an upper surface in which a plurality of active fins are defined;
    a gate structure overlapping at least one active fin of the plurality of active fins along a direction orthogonal to the upper surface of the active region;
    a source/drain region disposed on the plurality of active fins;
    a contact plug having a lower surface connected to the source/drain region;
    a metal via spaced apart from the contact plug along the direction orthogonal to the upper surface of the active re ion and positioned at a first level above the active region, higher than an upper surface of the contact plug;
    a metal line positioned at a second level, higher than the first level, and connected to the metal via, wherein the metal via and the metal line do not overlap the source/drain region along the direction orthogonal to the upper surface of the active region; and a via connection layer having an upper surface substantially coplanar with the upper surface of the contact plug, and extended from an upper portion of the contact plug and connected to the metal via.

16. The semiconductor device of claim 15, wherein the via connection layer is formed of a same material as a material of the contact plug.

17. The semiconductor device of claim 15, wherein the via connection layer is positioned at substantially a same level as an upper surface of the gate structure.

18. The semiconductor device of claim 15, wherein the contact plug includes a first contact plug and a second contact plug connected to the source/drain region provided as source/drain regions, respectively, with the gate structure positioned therebetween, and wherein the contact plug further includes a jumping connection layer disposed along an upper surface of the gate structure and connecting the first contact plug to the second contact plug.

19. The semiconductor device of claim 15, wherein the jumping connection layer is positioned at substantially a same level as the via connection layer.

20. A semiconductor device, comprising:

a substrate including a first active region and a second active region;

a first active fin positioned in the first active region;

a first source/drain region disposed on the first active fin;

a first contact plug positioned above the first source/drain region;

a first via connection layer positioned above the first contact plug, wherein the first via connection layer includes a first portion overlapping the first contact plug along a direction orthogonal to an upper surface of the substrate, and a second portion not overlapping the contact plug along the direction orthogonal to the upper surface of the substrate;

a first metal via disposed on the second portion of the first via connection layer;

a first metal line disposed on the first metal via;

a second active fin positioned in the second active region;

a second source/drain region disposed on the second active fin;

a second contact plug positioned above the second source/drain region;

a second via connection layer positioned above the second contact plug and overlapping the second contact plug along the direction orthogonal to the upper surface of the substrate;

a second metal via disposed on the second via connection layer; and a second metal line disposed on the second metal via.

21. The semiconductor device of claim 20, wherein the first metal via is positioned between the first active region and the second active region.

* * * * *